United States Patent
Lee et al.

(10) Patent No.: US 10,714,517 B2
(45) Date of Patent: Jul. 14, 2020

(54) IMAGE SENSOR

(71) Applicant: SAMSUNG ELECTRONICS CO., LTD., Suwon-si, Gyeonggi-do (KR)

(72) Inventors: Kang Sun Lee, Hwaseong-si (KR); Seung Ho Shin, Asan-si (KR); Hyung Jin Bae, Suwon-si (KR); Jin Ho Seo, Seoul (KR); Ji Hun Shin, Seongnam-si (KR); Moo Sup Lim, Yongin-si (KR); Young Tae Jang, Pyeongtaek-si (KR); Young Kyun Jeong, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 25 days.

(21) Appl. No.: 16/218,704

(22) Filed: Dec. 13, 2018

(65) Prior Publication Data
US 2019/0229138 A1    Jul. 25, 2019

(30) Foreign Application Priority Data

Jan. 23, 2018 (KR) .................. 10-2018-0008297
May 28, 2018 (KR) .................. 10-2018-0060446
Sep. 17, 2018 (KR) .................. 10-2018-0110823

(51) Int. Cl.
*H04N 5/355* (2011.01)
*H04N 5/353* (2011.01)
(Continued)

(52) U.S. Cl.
CPC .... *H01L 27/14616* (2013.01); *H01L 27/1463* (2013.01); *H01L 27/14603* (2013.01);
(Continued)

(58) Field of Classification Search
CPC ........ H01L 27/14616; H01L 27/14641; H01L 27/14634; H01L 27/14603; H01L 27/1463;
(Continued)

(56) References Cited

U.S. PATENT DOCUMENTS

| | | | |
|---|---|---|---|
| 7,595,830 B2 | 9/2009 | Oita et al. | |
| 8,269,717 B2 | 9/2012 | Omi et al. | |
| 9,854,184 B2 | 12/2017 | Velichko et al. | |
| 2010/0194947 A1* | 8/2010 | Ogura .................. | H04N 5/3595 348/301 |

(Continued)

FOREIGN PATENT DOCUMENTS

| | | |
|---|---|---|
| JP | 2017-084892 | 5/2017 |
| KR | 10-1536323 | 7/2015 |

(Continued)

*Primary Examiner* — Lin Ye
*Assistant Examiner* — Tuan H Le
(74) *Attorney, Agent, or Firm* — F. Chau & Associates, LLP

(57) ABSTRACT

An image sensor including: a first photodiode; a first circuit including an overflow transistor and a first transfer transistor connected to the first photodiode, a switch element connected to the first transfer transistor and a capacitor disposed between the first transfer transistor and the switch element, wherein the capacitor is a physical capacitor; a second photodiode; and a second circuit including a second transfer transistor connected to the second photodiode, a reset transistor connected to an output of the first circuit and a driving transistor connected to the second transfer transistor and the output of the first circuit.

20 Claims, 26 Drawing Sheets

(51) Int. Cl.
*H04N 5/3745* (2011.01)
*H01L 27/146* (2006.01)
*H01L 31/0203* (2014.01)

(52) U.S. Cl.
CPC .. *H01L 27/14634* (2013.01); *H01L 27/14641* (2013.01); *H01L 27/14643* (2013.01); *H04N 5/353* (2013.01); *H04N 5/3559* (2013.01); *H04N 5/35563* (2013.01); *H04N 5/37457* (2013.01); *H01L 27/14656* (2013.01); *H01L 31/0203* (2013.01)

(58) Field of Classification Search
CPC ......... H01L 27/14643; H01L 27/14656; H01L 31/0203; H04N 5/353; H04N 5/37457; H04N 5/35563; H04N 5/3559; H04N 5/369; H04N 5/378; H04N 5/3591; H04N 5/3575; H04N 5/3535; H04N 5/35554
See application file for complete search history.

(56) References Cited

U.S. PATENT DOCUMENTS

| | | | |
|---|---|---|---|
| 2015/0116565 A1* | 4/2015 | Kim | H04N 5/37457 |
| | | | 348/308 |
| 2017/0070691 A1* | 3/2017 | Nishikido | H04N 5/35581 |
| 2017/0118424 A1 | 4/2017 | Lule et al. | |
| 2017/0251153 A1 | 8/2017 | Roffet | |
| 2017/0264845 A1 | 9/2017 | Lee et al. | |
| 2017/0324917 A1* | 11/2017 | Mlinar | H04N 5/3592 |
| 2018/0366513 A1* | 12/2018 | Yang | H01L 27/14831 |
| 2019/0075261 A1* | 3/2019 | Machida | H04N 5/3745 |
| 2019/0096933 A1* | 3/2019 | Kido | H01L 27/14607 |
| 2020/0066773 A1* | 2/2020 | Tashiro | H04N 5/355 |

FOREIGN PATENT DOCUMENTS

| | | |
|---|---|---|
| KR | 10-2017-0104824 | 9/2017 |
| WO | 2017/073322 | 5/2017 |

\* cited by examiner

IMAGE SENSOR

CROSS-REFERENCE TO RELATED APPLICATIONS

This application claims priority under 35 U.S.C. § 119 to Korean Patent Application No. 10-2018-0008297 filed on Jan. 23, 2018, Korean Patent Application No. 10-2018-0060446 filed on May 28, 2018, and Korean Patent Application No. 10-2018-0110823 filed on Sep. 17, 2018 in the Korean Intellectual Property Office, the disclosures of which are incorporated by reference herein in their entireties.

TECHNICAL FIELD

The present inventive concept relates to an image sensor.

DESCRIPTION OF RELATED ART

An image sensor is a semiconductor-based sensor for receiving light to produce an electrical signal. For example, the image sensor converts light into an electrical signal that conveys information used to make an image. The image sensor may include a pixel array having a plurality of pixels, a circuit for driving the pixel array and generating an image, and the like. The plurality of pixels may include a photodiode for generating an electric charge in response to external light, and a pixel circuit for converting the electric charge generated by the photodiode into an electrical signal. The image sensor was traditionally employed in cameras for capturing still and video images, but is now widely applied to smartphones, tablet personal computers (PC)s, laptop computers, televisions, automobiles, and the like. In recent years, studies have been carried out to increase a dynamic range of the image sensor, and to accurately detect light from a light source in which a flicker phenomenon occurs.

SUMMARY

According to an exemplary embodiment of the present inventive concept, there is provided an image sensor including: a first photodiode; a first circuit including an overflow transistor and a first transfer transistor connected to the first photodiode, a switch element connected to the first transfer transistor and a capacitor disposed between the first transfer transistor and the switch element, wherein the capacitor is a physical capacitor; a second photodiode; and a second circuit including a second transfer transistor connected to the second photodiode, a reset transistor connected to an output of the first circuit and a driving transistor connected to the second transfer transistor and the output of the first circuit.

According to an exemplary embodiment of the present inventive concept, there is provided an image sensor including: a first photodiode; a first circuit including an overflow transistor and a first transfer transistor connected to the first photodiode, a switch element connected to the first transfer transistor and a metal-insulator-metal (MIM) capacitor disposed between the first transfer transistor and the switch element; a second photodiode; and a second circuit including a second transfer transistor connected to the second photodiode, a reset transistor connected to an output of the first circuit and a driving transistor connected to the second transfer transistor and the output of the first circuit.

According to an exemplary embodiment of the present inventive concept, there is provided an image sensor including: a first photodiode; a first circuit including an overflow transistor and a first transfer transistor connected to the first photodiode, a switch element connected to the first transfer transistor and a capacitor disposed between the first transfer transistor and the switch element; a second photodiode; and a second circuit including a second transfer transistor connected to the second photodiode, a reset transistor connected to an output of the first circuit and a driving transistor connected to the output of the first circuit and a floating diffusion node, wherein a conversion gain is different when the driving transistor is turned on and off.

According to an exemplary embodiment of the present inventive concept, there is provided an image sensor including: a pixel array including a plurality of pixels, a first pixel including a first photodiode, a first pixel circuit, a second photodiode, and a second pixel circuit, wherein the first pixel circuit includes an overflow transistor and a first transfer transistor connected to the first photodiode, a switch element connected to the first transfer transistor and a capacitor connected between the first transfer transistor and the switch element, wherein the second pixel circuit includes a second transfer transistor connected to the second photodiode, a driving transistor connected to a floating diffusion node, and a reset transistor connected to a pixel voltage, wherein the image sensor further comprises a controller configured to turn the driving transistor on and off to sense the second photodiode a plurality of times.

According to an exemplary embodiment of the present inventive concept, there is provided a method of operating an image sensor including a first photodiode; a second photodiode; a first circuit and a second circuit, the first circuit including an overflow transistor and a first transfer transistor connected to the first photodiode, a switch element connected to the first transfer transistor and a capacitor disposed between the first transfer transistor and the switch element, the second circuit including a second transfer transistor connected to the second photodiode, a reset transistor connected to an output of the first circuit and a driving transistor connected to the second transfer transistor, the method including: sensing the second photodiode for a first period of time when the driving transistor is off; and sensing the second photodiode for a second period of time when the driving transistor is off, wherein the first period of time is longer than the second period of time, wherein the first period of time overlaps a period of time in which the first photodiode is sensed and read, and the second period of time does not overlap the period of time in which the first photodiode is sensed and read.

BRIEF DESCRIPTION OF DRAWINGS

The above and other features of the present inventive concept will be more clearly understood by describing in detail exemplary embodiments thereof in conjunction with the accompanying drawings, in which.

DETAILED DESCRIPTION OF THE EMBODIMENTS

Figure 1:
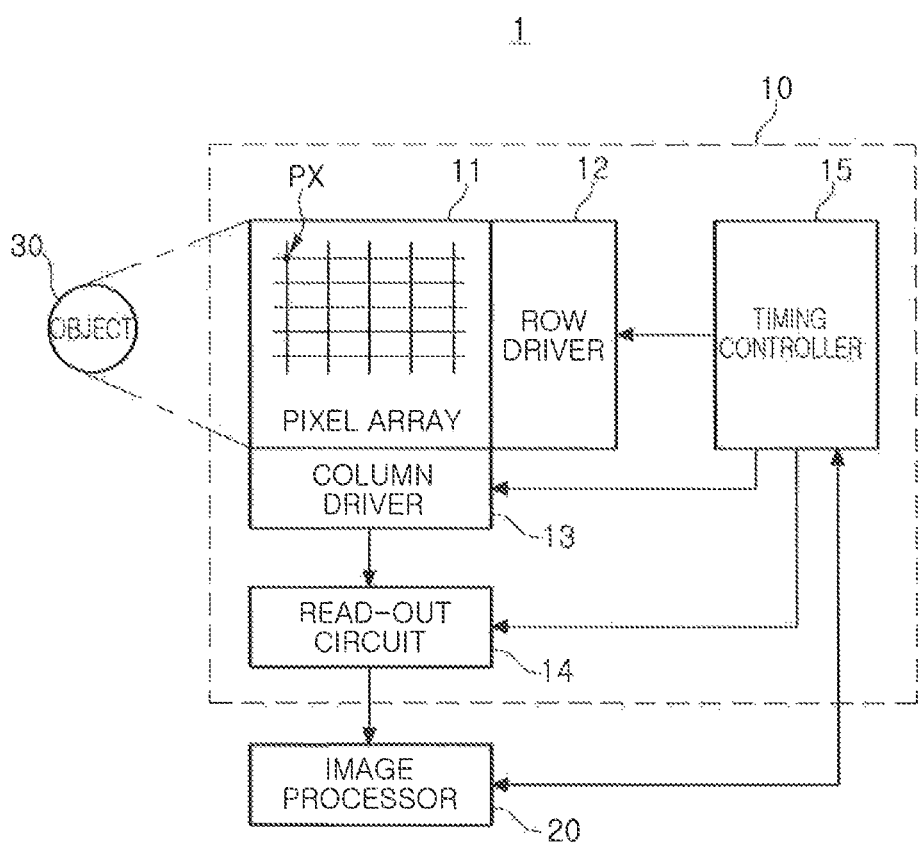
FIG. 1 is a block diagram illustrating an image sensor according to an exemplary embodiment of the present inventive concept.

Hereinafter, exemplary embodiments of the present inventive concept will be described with reference to the accompanying drawings. Like reference numerals may refer to like elements in the drawings.

FIG. 1 is a block diagram illustrating an image processing device including an image sensor according to an exemplary embodiment of the present inventive concept.

Referring to FIG. 1, an image processing device 1 may include an image sensor 10, and an image processor 20. The image sensor 10 may include a pixel array 11, a row driver 12, a column driver 13, a read-out circuit 14, a timing controller 15, and the like.

The image sensor 10 may operate according to a control command received from the image processor 20, and may convert light transmitted from an object 30 into an electrical signal and output the electrical signal to the image processor 20. The pixel array 11 included in the image sensor 10 may include a plurality of pixels PXs. The plurality of pixels PXs may include photodiodes for receiving light to generate an electric charge. In an exemplary embodiment of the present inventive concept, each of the plurality of pixels PXs may include two or more photodiodes.

Each of the plurality of pixels PXs may include a pixel circuit for generating an electrical signal from an electric charge generated by the photodiode. In an exemplary embodiment of the present inventive concept, the pixel circuit may include a transfer transistor, a driving transistor, a selection transistor, a reset transistor, or the like. When one pixel PX has two or more photodiodes, each pixel PX may include a pixel circuit for processing an electric charge generated in each of the two or more photodiodes. For example, when one pixel PX has two or more photodiodes, the pixel circuit may include two or more of at least the transfer transistor, the driving transistor, the selection transistor, and the reset transistor.

In an exemplary embodiment of the present inventive concept, one pixel PX may include a first photodiode and a second photodiode. In addition, in an exemplary embodiment of the present inventive concept, one pixel PX may include a first pixel circuit for processing an electric charge generated in the first photodiode, and a second pixel circuit for processing an electric charge generated in the second photodiode. The first pixel circuit and the second pixel circuit may comprise a plurality of semiconductor elements, respectively. The first pixel circuit may generate a first pixel signal from an electric charge generated in the first photodiode, and output the first pixel signal to a first column line. The second circuit may generate a second pixel signal from an electric charge generated in the second photodiode, and output the second pixel signal to a second column line. Each of the first and second pixel signals may include a reset voltage and a pixel voltage.

The row driver 12 may drive the pixel array 11 on a row basis. For example, the row driver 12 may generate a transfer control signal for controlling the transfer transistor of each pixel PX, a reset control signal for controlling the reset transistor of each pixel PX, a selection control signal for controlling the selection transistor of each pixel PX, or the like.

The column driver 13 may include a correlated double sampler (CDS), an analog-to-digital converter (ADC), or the like. The correlated double sampler may perform correlated double sampling by receiving a pixel signal through column lines connected to pixels PXs included in a row selected by a row selection signal supplied by the row driver 12. The analog-to-digital converter may convert an output of the correlated double sampler into a digital signal, and deliver the digital signal to the read-out circuit 14.

The read-out circuit 14 may include a latch or buffer circuit for temporarily storing a digital signal, an amplifying circuit, and the like. The read-out circuit 14 may process the digital signal received from the column driver 13 to generate image data. Operational timings of the row driver 12, the column driver 13 and the read-out circuit 14 may be determined by the timing controller 15. The timing controller 15 may control the row driver 12, the column driver 13 and the read-out circuit 14 based on a control command from the image processor 20. The image processor 20 may process image data output from the read-out circuit 14, and output the processed image data to a display device or the like, or store the processed image data in a storage device such as a memory. Alternatively, when the image processing device 1 is mounted on an autonomous vehicle, the image processor 20 may process image data, and may transfer the processed image data to a main controller for controlling the autonomous vehicle.

Figure 2:
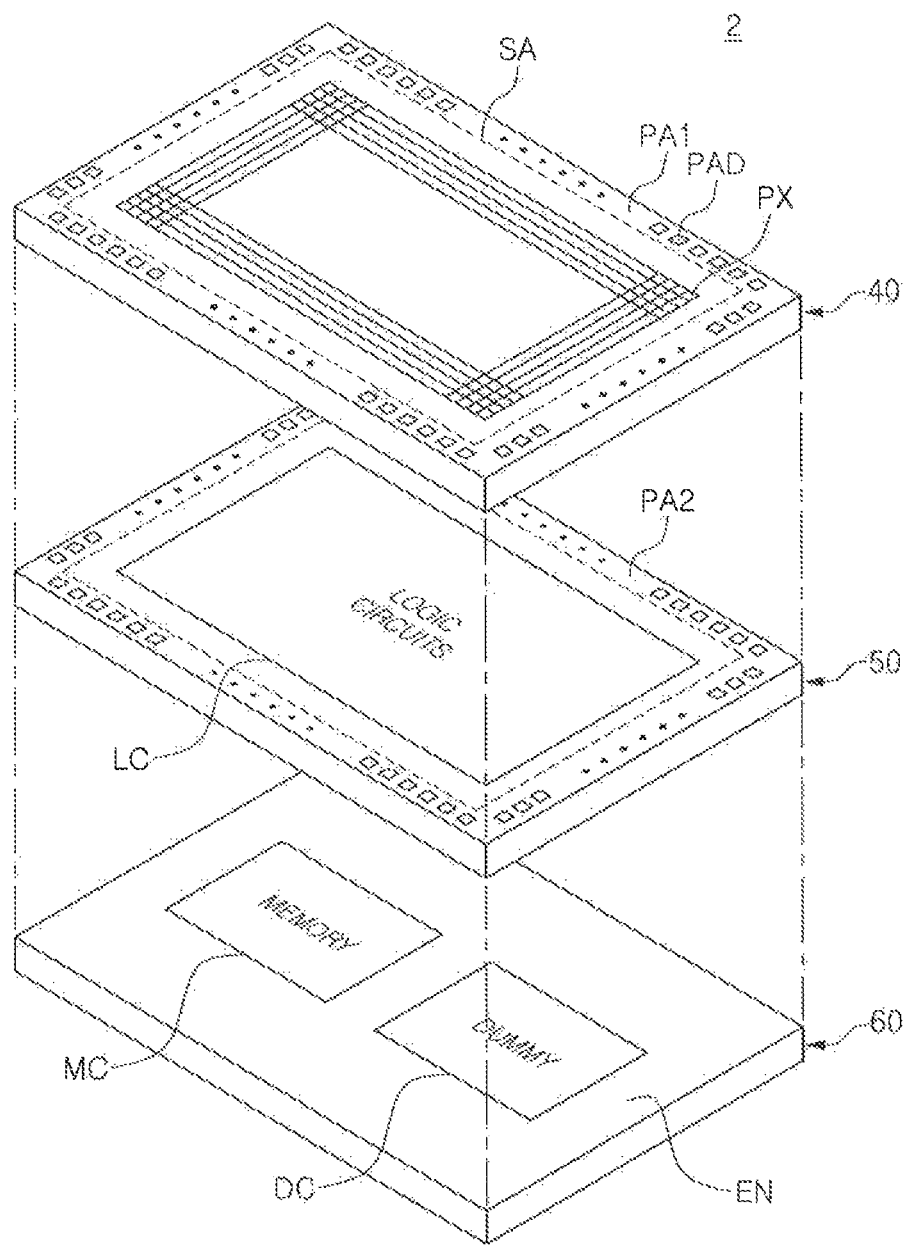
FIGS. 2 and 3 are views illustrating an image processing device including an image sensor according to an exemplary embodiment of the present inventive concept.

FIG. 2 is a view illustrating an image processing device including an image sensor according to an exemplary embodiment of the present inventive concept.

Referring to FIG. 2, an image processing device 2 may include a pixel array region 40, a logic circuit region 50 below the pixel array region 40, a memory region 60 below the logic circuit region 50, and the like. The pixel array region 40, the logic circuit region 50 and the memory region 60 may be stacked on each other. In an exemplary embodiment of the present inventive concept, the pixel array region 40 may be stacked on the logic circuit region 50 at a wafer level, and the memory region 60 may be attached to a lower portion of the logic circuit region 50 at a chip level.

The pixel array region 40 may include a sensing area SA in which a plurality of pixels PXs are provided, and a first pad area PA1 provided around the sensing area SA. The first pad area PA1 may include a plurality of upper pads PADs. The plurality of upper pads PADs may be connected to a second pad area PA2 of the logic circuit area 50 through a via, and to a logic circuit LC.

Each of the plurality of pixels PXs may include a photodiode for receiving light to generate an electric charge, a pixel circuit for converting the electric charge generated by the photodiode into an electrical signal, and the like. The photodiode may include an organic photodiode or a semiconductor photodiode. In an exemplary embodiment of the present inventive concept, a plurality of semiconductor photodiodes may be included in each of the plurality of pixels PXs. The pixel circuit may include a plurality of transistors for converting the electric charge generated by the photodiode into an electrical signal.

The logic circuit region 50 may include a plurality of circuit elements formed in the logic circuit LC. The plurality of circuit elements included in the logic circuit LC may be circuits for driving a pixel circuit provided in the pixel array region 40, such as a row driver, a column driver, and a timing controller. The plurality of circuit elements included in the logic circuit LC may be connected to the pixel circuit through the first and second pad areas PA1 and PA2.

The memory region 60 provided on the lower portion of the logic circuit region 50 may include a memory chip MC, a dummy chip DC, and a protection layer EN for sealing the memory chip MC and the dummy chip DC. The memory chip MC may be a dynamic random access memory (DRAM) or a static random access memory (SRAM). The dummy chip DC may not actually store data. The memory chip MC may be electrically connected to at least a portion of the circuit elements included in the logic circuit region 50 by a bump. In an exemplary embodiment of the present inventive concept, the bump may be a micro-bump.

Figure 3:
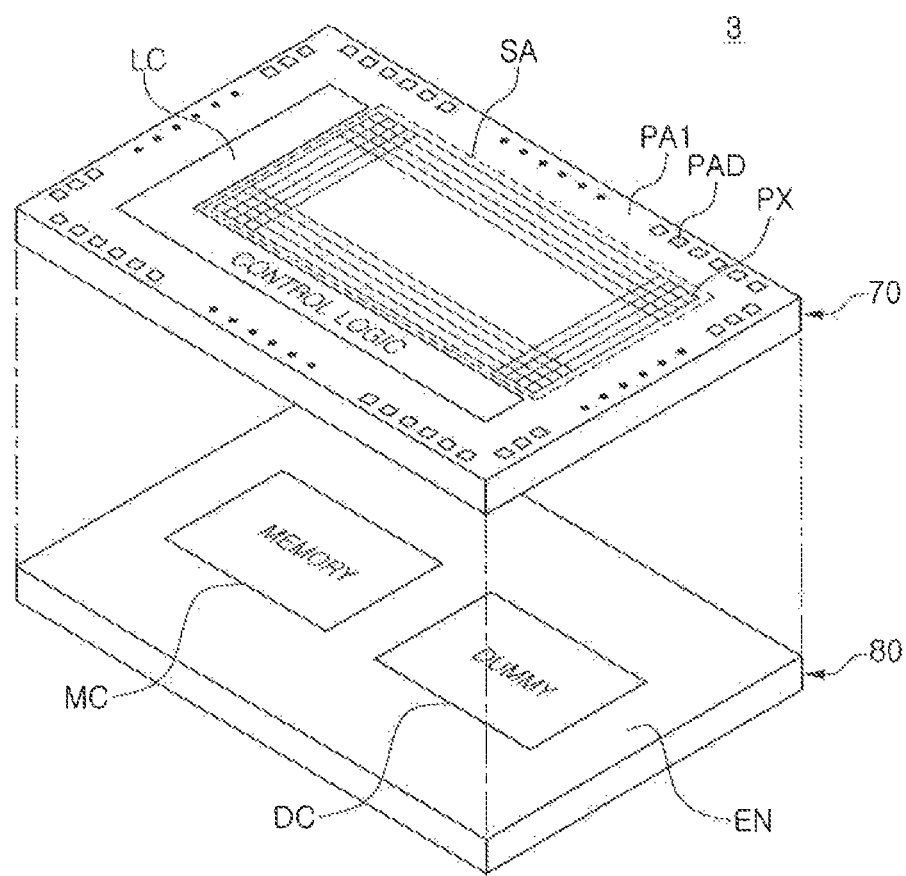

Next, referring to FIG. 3, an image sensor 3 according to an exemplary embodiment of the present inventive concept may include a first layer 70 and a second layer 80. The first layer 70 includes a sensing region SA in which a plurality of pixels PX are provided, a control logic region LC in which elements for driving the plurality of pixels PX are provided, and a first pad area PA1 provided around the control logic area LC. The first pad area PA1 includes a plurality of upper pads PAD to which a memory chip MC provided in the second layer 80 can be connected through a via. The second layer 80 may include the memory chip MC, a dummy chip DC and a protective layer EN sealing the memory chip MC and the dummy chip DC.

Figure 4:
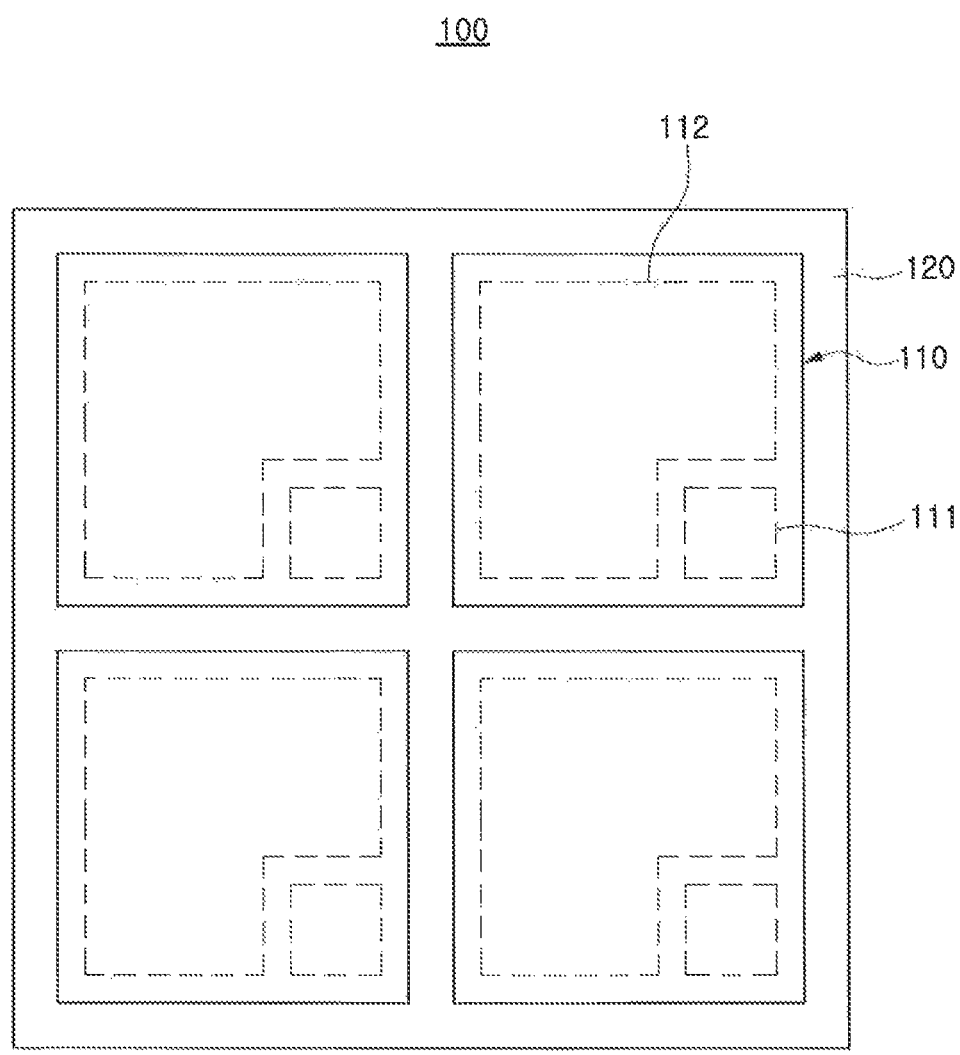
FIGS. 4 and 5 are plan views illustrating a pixel array included in an image sensor according to an exemplary embodiment of the present inventive concept.
Figure 5:
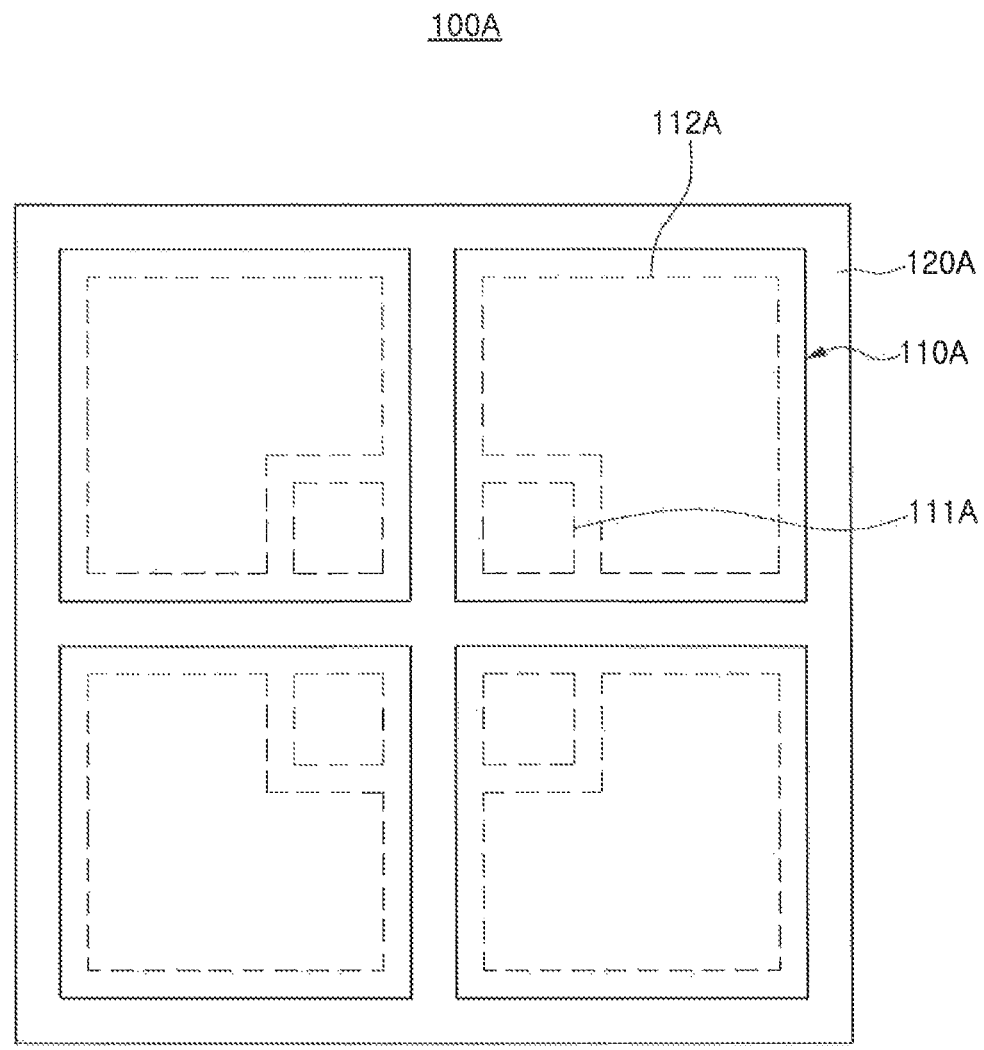

FIGS. 4 and 5 are plan views illustrating a pixel array included in an image sensor according to an exemplary embodiment of the present inventive concept.

Referring to FIG. 4, a pixel array 100 may include a plurality of pixels 110. The plurality of pixels 110 may be arranged in a matrix form along a plurality of rows and columns on an X-Y plane. An isolation region 120 may be formed between the plurality of pixels 110 to prevent cross-talk. The isolation region 120 may include an insulating material such as an oxide, and may be formed by a deep trench isolation (DTI) process. Sidewalls of the isolation region 120 adjacent to the plurality of pixels 110 may be formed of a material having high reflectance.

Each of the plurality of pixels 110 may include a photodiode for receiving light to generate an electric charge, and a plurality of semiconductor elements that convert the electric charge generated by the photodiode into an electrical signal. For example, each of the plurality of pixels 110 may include a first photodiode 111 and a second photodiode 112. The first photodiode 111 and the second photodiode 112 may be arranged adjacent to each other on the X-Y plane. For example, the first photodiode 111 and the second photodiode 112 may be disposed at the same level in a direction along a Z-axis.

In an exemplary embodiment of the present inventive concept, the first photodiode 111 may have a light receiving area larger than the second photodiode 112. Therefore, the second photodiode 112 may be more easily saturated than the first photodiode 111. In an exemplary embodiment of the present inventive concept, the first photodiode 111 may be used for general image processing, while the second photodiode 112 may be used for accurately detecting an external light source in which a flicker phenomenon occurs. The second photodiode 112 may also be used for image processing to increase dynamic range. When the image sensor according to an exemplary embodiment of the present inventive concept is applied to an autonomous vehicle or the like, it is possible to accurately detect a signal lamp, a head lamp or a tail lamp of a nearby vehicle, or the like, which uses a light emitting diode (LED) in which a flicker phenomenon occurs.

The second photodiode 112 may have a light receiving area smaller than that of the first photodiode 111. This way, the second photodiode 112 can be more easily saturated. In an exemplary embodiment of the present inventive concept, a means for preventing saturation of the second photodiode 112, or a means for generating accurate image data despite the saturation of the second photodiode 112 may be provided to prevent erroneous sensing of light of a signal lamp and/or a nearby vehicle using an LED.

The arrangement of the first photodiode 111 and the second photodiode 112 is not necessarily limited to that illustrated in FIG. 4, and may be variously modified. In the pixel array 100A according to the embodiment illustrated in FIG. 5, in the four pixels 110A adjacent to each other, the first photodiodes 111A may be disposed adjacent to each other. The second photodiode 112A has a light receiving area smaller than that of the first photodiode 111A and the isolation region 120A may be provided between the pixels 110A to prevent crosstalk.

Figure 6:
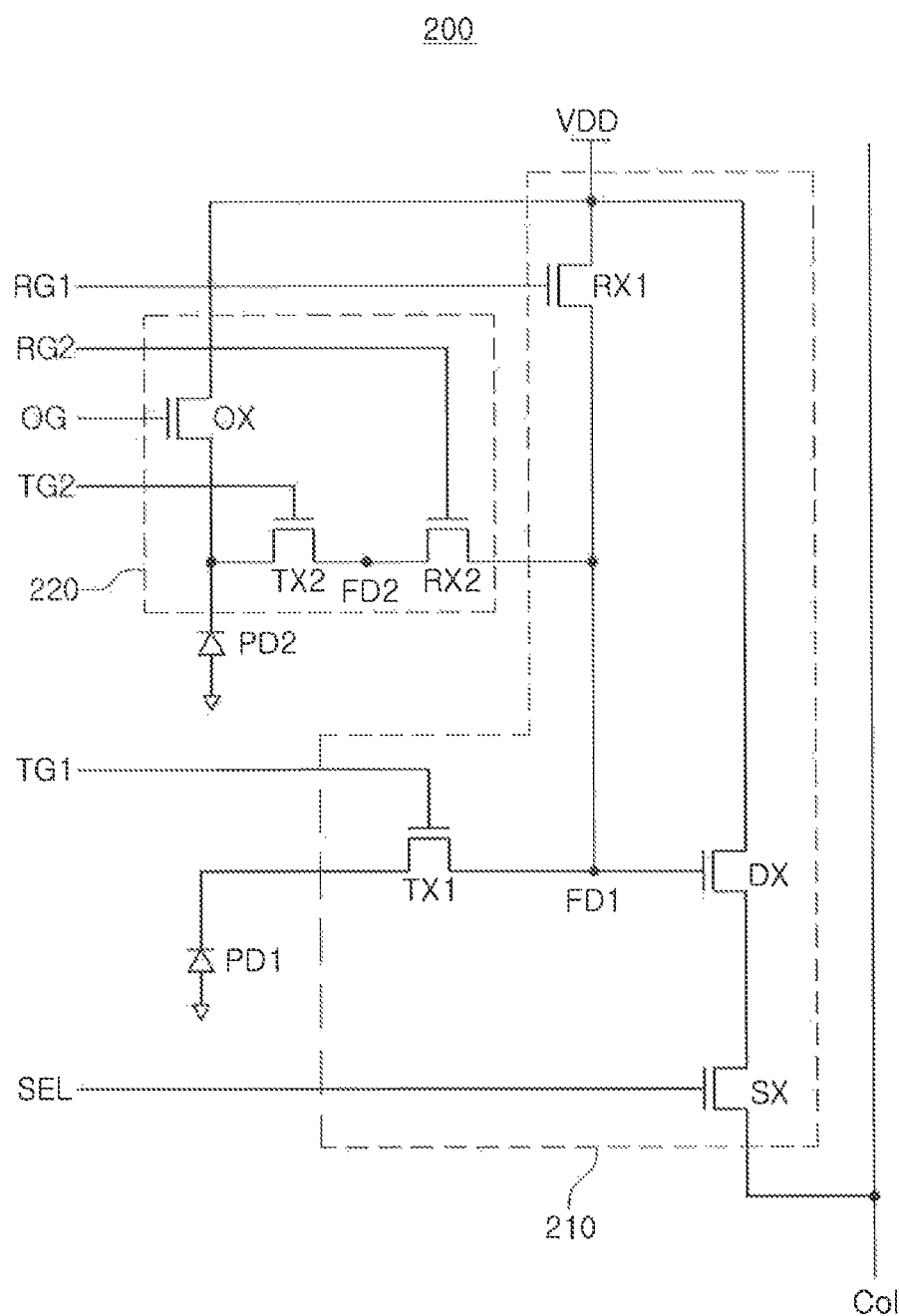
FIG. 6 is a circuit diagram illustrating a pixel circuit included in an image sensor according to an exemplary embodiment of the present inventive concept.

FIG. 6 is a circuit diagram illustrating a pixel circuit included in an image sensor according to an exemplary embodiment of the present inventive concept.

Referring to FIG. 6, a pixel circuit 200 according to an exemplary embodiment of the present inventive concept may include a first pixel circuit 210 and a second pixel circuit 220. The first pixel circuit 210 may output an electrical signal using an electric charge generated by a first photodiode PD1, and the second pixel circuit 220 may output an electrical signal using an electric charge generated by a second photodiode PD2. The first photodiode PD1 has a light receiving area larger than that of the second photodiode PD2.

The first pixel circuit 210 may include a first reset transistor RX1, a first transfer transistor TX1, a driving transistor DX, and a selection transistor SX. The first photodiode PD1 may be connected to a first floating diffusion FD1 via the first transfer transistor TX1. The first reset transistor RX1 may be connected to a supply or pixel voltage VDD.

The first transfer transistor TX1 may transfer the electric charge accumulated in the first photodiode PD1 to the first floating diffusion FD1, based on a first transfer control signal TG1 transferred from a row driver. The first photodiode PD1 may generate electrons as a main charge carrier. The driving transistor DX may operate as a source follower buffer amplifier by the electric charge accumulated in the first floating diffusion FD1. The driving transistor DX may amplify the electric charge accumulated in the first floating diffusion FD1 to generate an electric signal, and transfer the electric signal to the selection transistor SX.

The selection transistor SX may be operated by a selection control signal SEL input by the row driver, and may perform switching and addressing operations. When the selection control signal SEL is applied from the row driver, a voltage corresponding to the electric signal may be output to a column line Col connected to the selection transistor SX. The voltage may be detected by a column driver and a read-out circuit, connected to the column line Col. The column driver and the read-out circuit may detect a reset voltage in a state in which no electric charge is accumulated in the first floating diffusion FD1, and detect a pixel voltage in a state in which the electric charge is transferred to the first floating diffusion FD1. In an exemplary embodiment of the present inventive concept, the image sensor may generate an image data by calculating a difference between the reset voltage and the pixel voltage.

The second photodiode PD2 may be connected to an overflow transistor OX and a second transfer transistor TX2 of the second pixel circuit 220. The second photodiode PD2 may generate electrons as a main charge carrier, in a similar manner to the first photodiode PD1. The electric charge generated by the second photodiode PD2 may move to a second floating diffusion FD2, when the second transfer transistor TX2 is turned on. The second photodiode PD2 may generate an electric charge in response to light when the second transfer transistor TX2 is turned off. Each time the second transfer transistor TX2 is turned on, the electric charge generated by the second photodiode PD2 may be accumulated in the second floating diffusion FD2. The overflow transistor OX may be connected to a supply or pixel voltage VDD.

In an exemplary embodiment of the present inventive concept, the overflow transistor OX may be used to prevent saturation of the second photodiode PD2. The overflow transistor OX may prevent saturation of the second photodiode PD2, by repeatedly turning on and off to remove at least a portion of the electric charge generated by the second photodiode PD2. The repeated switching of the overflow transistor OX on and off may occur over a predetermined period of time. The second transfer transistor TX2 may be turned on, while the overflow transistor OX is turned off, to transfer the electric charge generated by the second photodiode PD2 to the second floating diffusion FD2. To prevent an unintended reset of the second floating diffusion FD2, the second transfer transistor TX2 and the overflow transistor OX may not be turned on at the same time. A second reset transistor RX2 may be turned off, while the electric charge of the second photodiode PD2 is moved to the second floating diffusion FD2. This way, the electric charge generated in the first photodiode PD1 and the electric charge generated in the second photodiode PD2 are not combined.

In the embodiment illustrated in FIG. 6, the first photodiode PD1 and the second photodiode PD2 may share the column line Col. Therefore, while the first pixel voltage generated using the electric charge of the first photodiode PD1 is output to the column line Col, the second photodiode PD2 is separated from the column line Col. In the embodiment illustrated in FIG. 6, when the first pixel voltage is output to the column line Col, at least one of the second reset transistor RX2 and the second transfer transistor TX2 may be turned off to separate the second photodiode PD2 from the column line Col. The first transfer transistor TX1 may be turned on to accumulate the electric charge of the first photodiode PD1 in the first floating diffusion FD1. This way, a first pixel voltage is generated using the electric charge of the first photodiode PD1, and is output to the column line Col.

Similarly, when a second pixel voltage corresponding to the electric charge of the second photodiode PD2 is output to the column line Col, the first photodiode PD1 may be separated from the column line Col. In the embodiment illustrated in FIG. 6, when the second pixel voltage is output to the column line Col, the first transfer transistor TX1 may be turned off to separate the first photodiode PD1 from the column line Col. The second transfer transistor TX2 and the second reset transistor RX2 may be turned on to connect the first floating diffusion FD1 and the second floating diffusion FD2. This way, a second pixel voltage is generated using the electric charge of the second photodiode PD2, and is output to the column line Col. The electric charge of the second photodiode PD2 may be accumulated in the first floating diffusion FD1 and the second floating diffusion FD2, and the driving transistor DX may convert the electric charge to a voltage.

In an exemplary embodiment by the driving transistor DX, the second photodiode PD2 may be used to sense an external light source in which a flicker phenomenon occurs, or to increase a dynamic range of an image sensor. To increase the dynamic range of the image sensor, when the first pixel voltage generated from the electric charge of the first photodiode PD1 is output over a plurality of times, the second pixel voltage generated from the electric charge of the second photodiode PD2 may be output once.

The first photodiode PD1 may have a relatively larger area than the second photodiode PD2. In an exemplary embodiment by the driving transistor DX, an image expressing an external light source in which a flicker phenomenon occurs may be generated using an electric charge generated by the second photodiode PD2. In addition, an electric charge generated by the first photodiode PD1 may be used for general image processing. In addition, the dynamic range, the image quality, and the like of the image sensor may be increased by adjusting an exposure time in which each of the first photodiode PD1 and the second photodiode PD2 receives light. The following description will be made with reference to FIG. 7.

Figure 7:
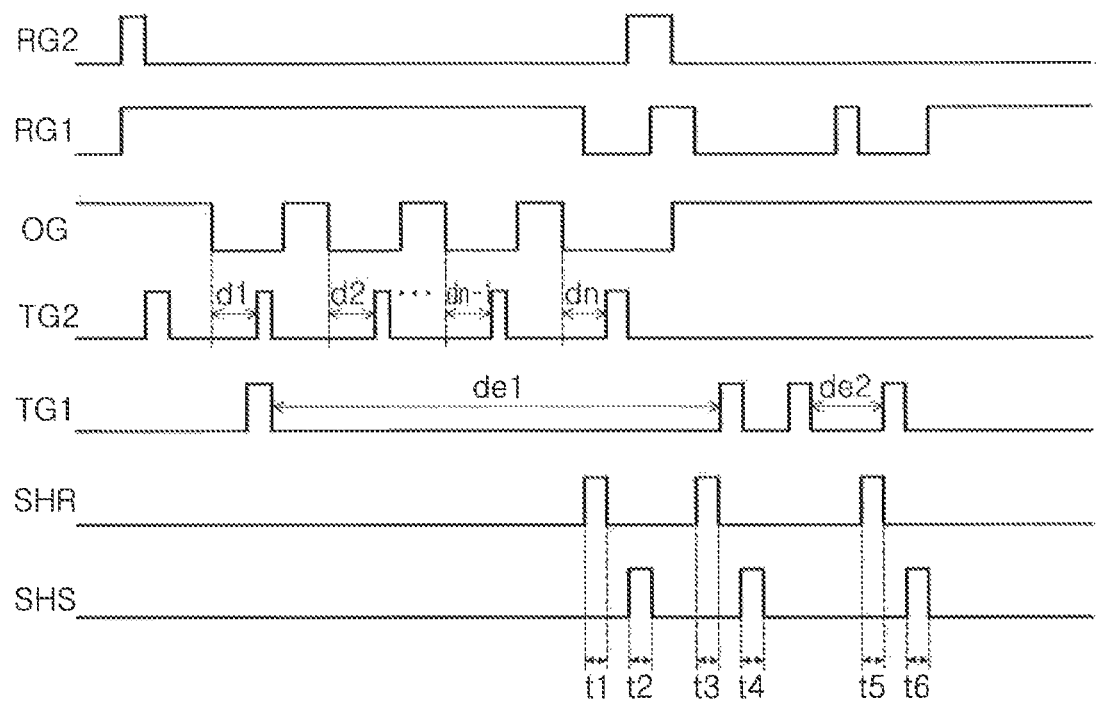
FIG. 7 is a view illustrating an operation of an image sensor according to an exemplary embodiment of the present inventive concept.

FIG. 7 is a view illustrating an operation of an image sensor according to an exemplary embodiment of the present inventive concept. In an exemplary embodiment of the present inventive concept, FIG. 7 may be a timing diagram for illustrating operations of image sensors in different modes of operation.

First, while a dynamic range of an image sensor may be increased, an image expressing an external light source in which a flicker phenomenon occurs may be generated by an operation according to an exemplary embodiment of the present inventive concept illustrated in FIG. 7. Referring to FIG. 7, the operation of the image sensor according to an exemplary embodiment of the present inventive concept may start, as a first reset transistor RX1 and a second reset transistor RX2 are turned on to reset voltages of a first floating diffusion FD1 and a second floating diffusion FD2. The first reset transistor RX1 may be turned on by a first reset control signal RG1, and the second reset transistor RX2 may be turned on by a second reset control signal RG2.

When the voltages of the first and second floating diffusions FD1 and FD2 are reset, a second transfer transistor TX2 and an overflow transistor OX may be alternately turned on and off, and an electric charge generated by a second photodiode PD2 may be accumulated in the second floating diffusion FD2. The overflow transistor OX may be turned on and off using an overflow control signal OG, and the second transfer transistor TX2 may be turned on and off by a second transfer control signal TG2. The second reset transistor RX2 may maintain a turned-off state, such that the electric charge accumulated in the second floating diffusion FD2 is not moved (e.g., leaked) to the first floating diffusion FD1. In addition, the first reset transistor RX1 may maintain a turned on state such that the voltage of the first floating diffusion FD1 is sufficiently reset.

In an exemplary embodiment of the present inventive concept illustrated in FIG. 7, the electric charge generated by the second photodiode PD2 may be accumulated in the second floating diffusion FD2 over n times (where n is a natural number). Referring to FIG. 7, the second photodiode PD2 may be exposed to light during a plurality of times (d1, d2, ..., dn−1, dn) to generate an electric charge. The electric charge generated by the second photodiode PD2 may be accumulated in the second floating diffusion FD2, each time the plurality of times (d1, d2, ..., dn−1, dn) elapse. Each of the plurality of times (d1, d2, ..., dn−1, dn) may be set as an amount of time the second photodiode PD2 can be exposed without being saturated. According to the present embodiment, the electric charge generated by the second photodiode PD2 may be transferred to the second floating diffusion FD2 immediately.

The number of the plurality of times (d1, d2, ..., dn−1, dn) and the respective lengths of the plurality of times (d1, d2, ..., dn−1, dn) may be determined in consideration of an operating frequency and a duty ratio of a commercial LED, or the like. For example, when the operating frequency of the LED is about 100 Hz and the duty ratio is about 10%, the total sum of the plurality of times (d1, d2, d ..., n−1, dn) may be 10 msec or less, and a number n, e.g., the number of the plurality of times (d1, ..., d2, dn−1, dn), may be 10 or more. By setting the plurality of times (d1, d2, ..., dn−1, dn) as described above, at least one of the plurality of times (d1, d2, ..., dn−1, dn) may be overlapped with a turn-on time of the LED. Therefore, the first photodiode PD1 may generate the electric charge in response to light of a turned on LED, and may accurately detect light of an LED operating in a pulse-width-modulation manner.

The image sensor may turn the second reset transistor RX2 off and turn the selection transistor SX on to detect a first reset voltage, before the electric charge generated by the second photodiode PD2 is transferred to the second floating diffusion FD2 during a period of the last $n^{th}$ time. The column driver and the read-out circuit connected to the column line Col of the pixel circuit may include a sampling circuit for detecting a voltage of the column line Col. The sampling circuit may detect the first reset voltage during a first sampling time t1 and a reset voltage detecting signal SHR has a high (HIGH) logic value during the first sampling time t1.

In one example, the reset voltage detected by the sampling circuit during the first sampling time t1 may be the voltage of the first floating diffusion FD1. The first floating diffusion FD1 and the second floating diffusion FD2 may be reset together, since the first and second reset transistors RX1 and RX2 are simultaneously turned on at the beginning of operation. Therefore, the voltage of the first floating diffusion FD1 detected during the first sampling time t1 may be selected as the first reset voltage.

When the electric charge generated by the second photodiode PD2 is accumulated at the $n^{th}$ time in the second floating diffusion FD2, the image sensor may turn the second reset transistor RX2 on and the electric charge accumulated in the second floating diffusion FD2 may be shared with the first floating diffusion FD1. At the same time, the image sensor may turn the selection transistor SX on to detect the first pixel voltage generated from the electric charge of the second photodiode PD2 through the column line Col. The sampling circuit may detect the first pixel voltage during a second sampling time t2 in which the pixel voltage detecting signal SHS has a high logic value. The image sensor may calculate a difference between the first reset voltage and the first pixel voltage detected in each of the first sampling time t1 and the second sampling time t2 to generate first raw data. The first raw data may be data corresponding to the electric charges generated by the second photodiode PD2 when the second photodiode PD2 is exposed to light during the plurality of times (d1, d2, ..., dn−1, dn).

In addition, while the electric charges generated by the second photodiode PD2 are accumulated in the second floating diffusion FD2 over a plurality of times, the first transfer transistor TX1 may be sequentially turned on and off. For example, when the first transfer transistor TX1 is turned on, the first reset transistor RX1 may be turned on to remove the electric charge present in the first photodiode PD1, and to reset the first floating diffusion FD1. The first transfer transistor TX1 may then be turned off, such that the first photodiode PD1 and the first floating diffusion FD1 are separated from each other. The first transfer transistor TX1 may be turned off for at least a portion of the plurality of times in which the electric charge of the second photodiode PD2 accumulates in the second floating diffusion FD2. While the first transfer transistor TX1 is turned off, the first photodiode PD1 may be exposed to light and generate an electric charge.

For example, the first photodiode PD1 may be exposed to light during a first exposure time de1 to generate the electric charge. The first photodiode PD1 may have a larger area than the second photodiode PD2 such that the first exposure time de1 is longer than each of the plurality of times (d1, d2, ..., dn−1, dn) in which the second photodiode PD2 is exposed to light. For example, the first exposure time de1 may be set to be longer than the sum of the plurality of times (d1, d2, ..., dn−1, dn).

During a third sampling time t3 in which the reset voltage detecting signal SHR has a high logic value, before the first exposure time de1 ends, the image sensor may detect the voltage of the first floating diffusion FD1 as the second reset voltage. Referring to FIG. 7, the first reset transistor RX1 may be turned on to reset the first floating diffusion FD1, before the third sampling time t3. The third sampling time t3 may be a time within the first exposure time de1. When the first exposure time de1 ends, the first transfer transistor TX1 may be turned on to transfer the electric charge accumulated in the first photodiode PD1 to the first floating diffusion FD1.

The image sensor may detect a second pixel voltage corresponding to the electric charge transferred to the first floating diffusion FD1 during a fourth sampling time t4, after the first transfer transistor TX1 is turned off. The image sensor may generate second raw data for generating an image by calculating a difference between the second reset voltage and the second pixel voltage detected in each of the third sampling time t3 and the fourth sampling time t4. When the fourth sampling time t4 ends, the first transfer transistor TX1 may be turned on to transfer an electric charge existing in the first photodiode PD1 to the first floating diffusion FD1. In this case, the electric charge of the first photodiode PD1 may be removed. Thereafter, the first reset transistor RX1 may be turned on to reset the first floating diffusion FD1.

In addition, the image sensor may expose the first photodiode PD1 to light during a second exposure time de2 that is shorter than the first exposure time de1, after the fourth sampling time t4 elapses, and may detect a voltage of the first floating diffusion FD1 as the third reset voltage, during a fifth time t5 included in the second exposure time de2. Referring to FIG. 7, the first reset transistor RX1 may be turned on to reset the first floating diffusion FD1, before the fifth time t5 starts. For example, the second exposure time de2 may be set to be shorter than the sum of the plurality of times (d1, d2, . . . , dn−1, dn).

When the second exposure time de2 ends, the first transfer transistor TX1 may be turned on to apply an electric charge generated by the first photodiode PD1 during the second exposure time de1 to the first floating diffusion FD1. The image sensor may detect the voltage of the first floating diffusion FD1 as the third pixel voltage for a sixth time t6, after the first transfer transistor TX1 is turned off. The image sensor may calculate a difference between the third reset voltage and the third pixel voltage detected in each of the fifth time t5 and the sixth time t6 to generate third raw data for generating an image.

In an exemplary embodiment of the present inventive concept, the image sensor may combine the first to third raw data obtained in each of the plurality of pixels to obtain a single image. As described above, the first to third raw data may be data obtained by exposing the first and second photodiodes PD1 and PD2 to light for different exposure times. Therefore, the first to third raw data may be combined to obtain a single image, to increase a dynamic range characteristic of the image.

In an exemplary embodiment of the present inventive concept explained referring to FIG. 7, it is assumed that the first raw data corresponding to an intermediate exposure time may be obtained using the second photodiode PD2, and the second and third raw data corresponding to a long exposure time and a short exposure time may be obtained using the first photodiode PD1. However, the present inventive concept is not limited thereto. For example, in various alternative embodiments, the second photodiode PD2 may be used to obtain raw data corresponding to a long exposure time or a short exposure time.

In addition, the first raw data may be used as data for accurately reflecting a light source such as an LED, etc., in which a flicker phenomenon occurs, in an image. In an exemplary embodiment of the present inventive concept, the second photodiode PD2 may be prevented from being saturated by using the overflow transistor OX, such that light of a light source such as an LED is accurately detected, even when the surrounding illuminance is relatively low. In addition, the first photodiode PD1 and the second photodiode PD2 are disposed in one pixel to use the electric charge of the second photodiode PD2 for generating a general image, and to use the first photodiode PD1 for detecting light of a light source such as an LED. Therefore, the frame rate of the image does not have to be sacrificed to detect the light of the light source such as the LED.

Figure 8:
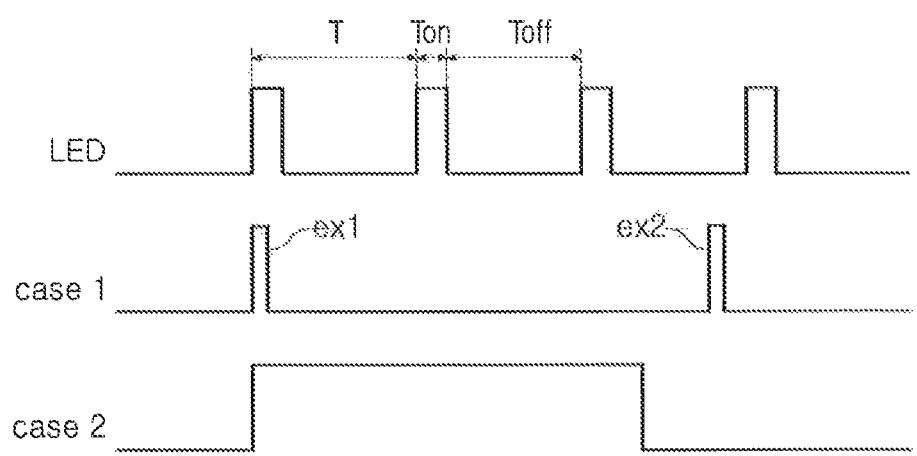
FIGS. 8 and 9 are views illustrating an operation of an image sensor according to an exemplary embodiment of the present inventive concept.
Figure 9:
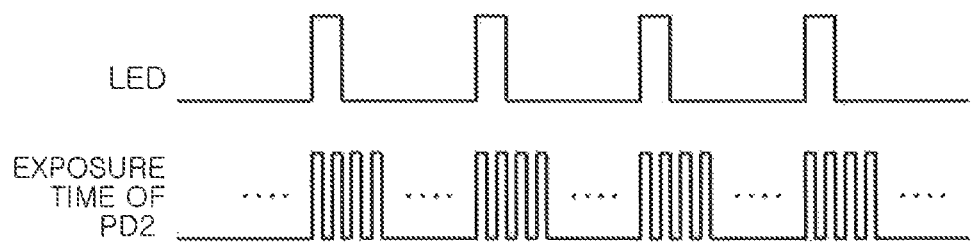

FIGS. 8 and 9 are views illustrating an operation of an image sensor according to an exemplary embodiment of the present inventive concept.

FIG. 8 is a view illustrating an operation of a general image sensor. In this embodiment, an LED may operate in a pulse-width-modulation PWM manner. Therefore, as illustrated in FIG. 8, the LED may operate according to a period T having a turn-on time $T_{on}$ and a turn-off time $T_{off}$.

First, referring to a first case (case 1) of FIG. 8, whether or not light emitted from the LED is detected by the image sensor may be determined, according to whether the exposure time of the photodiodes included in the image sensor to light is overlapped with the turn-on time $T_{on}$ of the LED. For example, since the first case (case 1) is a case in which the image sensor is exposed to a high illuminance environment, the exposure time of the photodiode in the first case (case 1) may be set short. A first exposure time ex1 in the first case (case 1) may overlap the turn-on time $T_{on}$ of the LED, and thus, a light of the LED may be accurately detected by using an electric charge generated in the photodiode during the first exposure time ex1.

In addition, in the first case (case 1), a second exposure time ex2 may not overlap the turn-on time $T_{on}$ of the LED. The duty ratio representing the ratio of the turn-on time $T_{on}$ to the whole period T in the PWM manner for driving the LED may not be 100%. Therefore, in the first case (case 1) in which the first and second exposure times ex1 and ex2 are set to be short, the exposure times of the photodiode may not overlap with the turn-on time $T_{on}$ of the LED as illustrated by the second exposure time ex2. Therefore, the light of the LED may not be accurately detected by the image produced by the electric charge generated in the photodiode during the second exposure time ex2.

Next, a second case (case 2) of FIG. 8 may be a case in which the image sensor is exposed to a low illuminance environment. Therefore, as illustrated in FIG. 8, the exposure time of the photodiode may be set to be long. In the second case (case 2), since the photodiode is exposed for a long period of time, the photodiode may be easily saturated. As a result, the light of the LED may not be accurately detected.

FIG. 9 is a view illustrating an operation of the image sensor according to an exemplary embodiment of the present inventive concept. As described above, the image sensor according to an exemplary embodiment of the present inventive concept may include a plurality of pixels, and each of the plurality of pixels may include a first photodiode and a second photodiode. The second photodiode may have a small area as compared with the first photodiode, and may be used for detecting a light source in which a flicker phenomenon occurs, such as an LED. Similar to the embodiment illustrated in FIG. 8, the LED may operate in a pulse-width-modulation manner, and have a turn-on time $T_{on}$ and a turn-off time $T_{off}$ within one period T.

Referring to FIG. 9, the exposure time of the second photodiode PD2 may be shorter than the turn-on time $T_{on}$ of the LED. As described above with reference to FIG. 7, the second photodiode PD2 may not be saturated due to on/off switching operations of the second transfer transistor TX2 and the overflow transistor OX, and thus, the second photodiode PD2 may be exposed to light over a plurality of times to generate an electric charge. An electric charge generated by the second photodiode PD2 may accumulate in the second floating diffusion FD2, every time the exposure time is ended. Therefore, saturation of the second photodiode PD2 may be prevented, regardless of the illuminance of the external environment to be captured by the image sensor. The second photodiode PD2 may be exposed to light for a short exposure time over a plurality of times, such that the turn-on time $T_{on}$ of the LED and the exposure time of the second photodiode PD2 do not deviate from each other. Therefore, LED light in which a flicker phenomenon occurs may be accurately detected.

Figure 10:
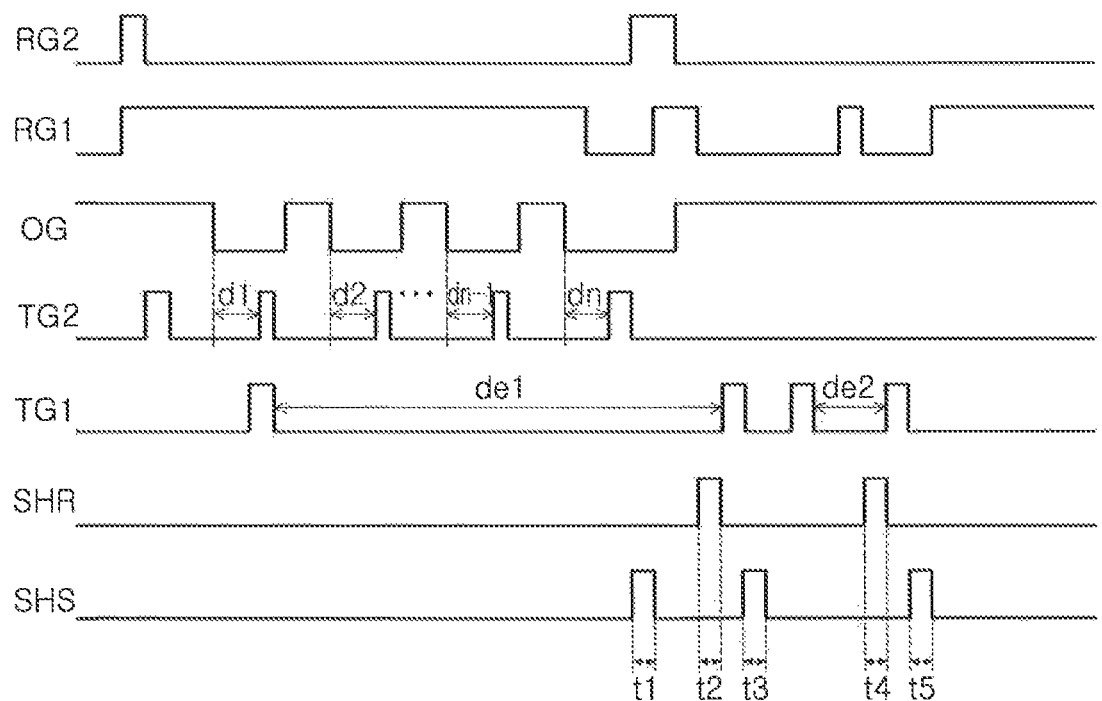
FIGS. 10, 11 and 12 are views illustrating an operation of an image sensor according to an exemplary embodiment of the present inventive concept.
Figure 11:
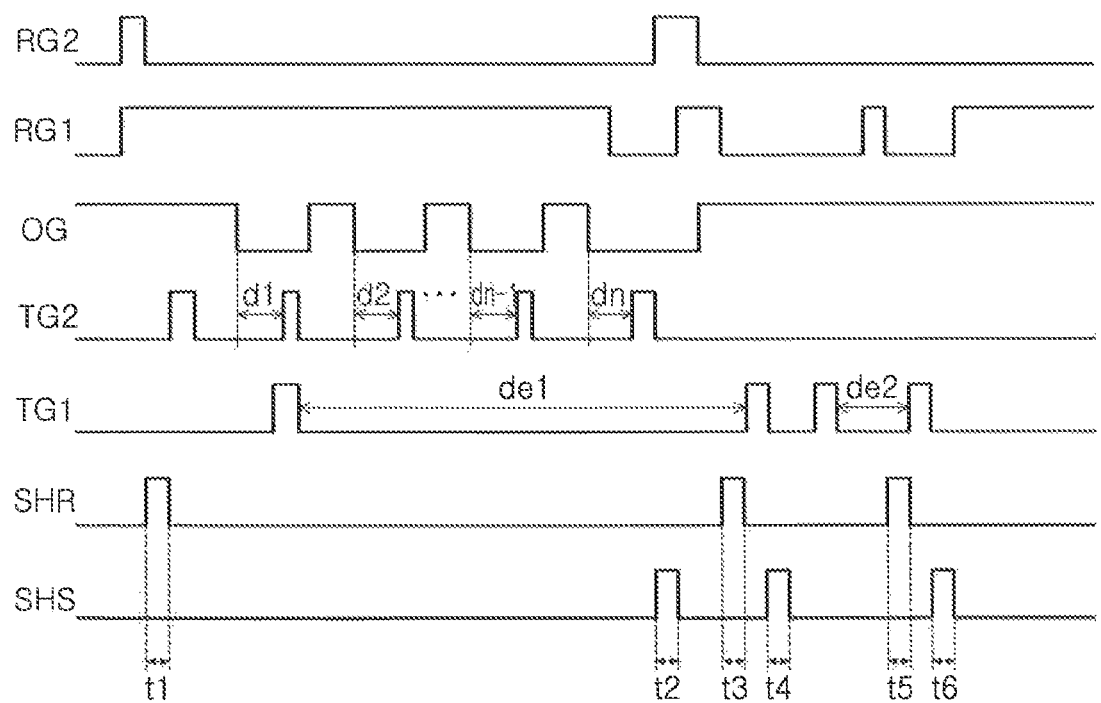
Figure 12:
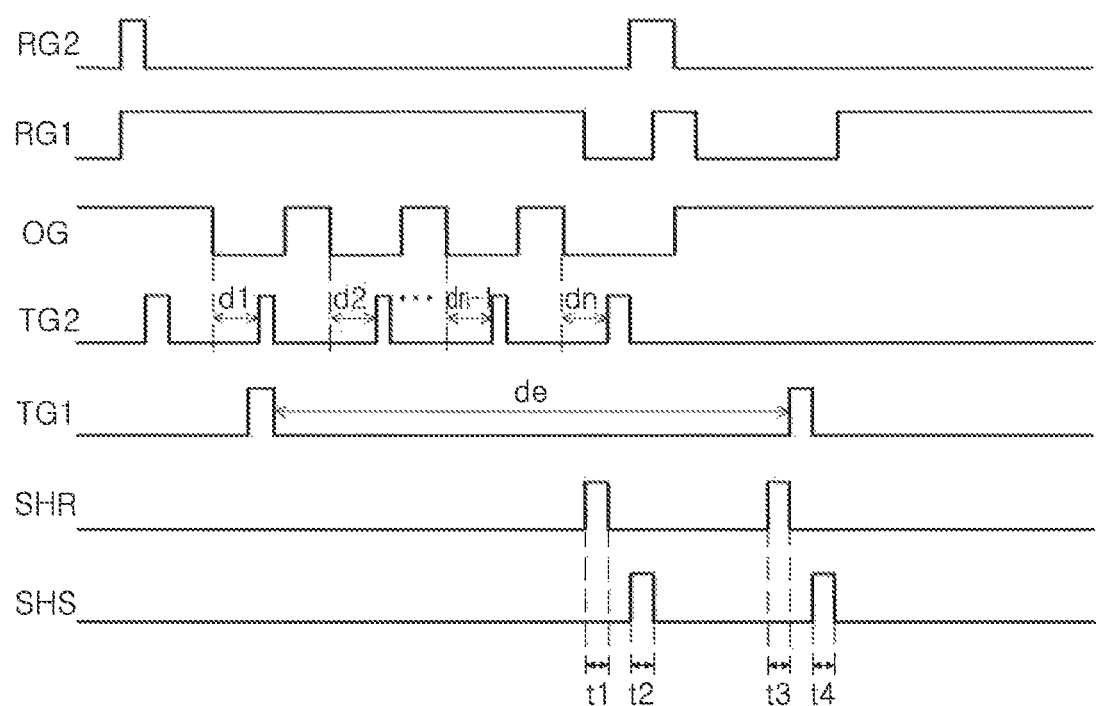

FIGS. 10 to 12 are views illustrating an operation of an image sensor according to an exemplary embodiment of the present inventive concept. FIGS. 10 to 12 may be timing diagrams illustrating an operation of an image sensor having the pixel circuit according to the embodiment illustrated in FIG. 6.

Referring to FIG. 10, an operation of an image sensor according to an exemplary embodiment of the present inventive concept may start, such that the first reset transistor RX1 and the second reset transistor RX2 are turned on to reset voltages of the first floating diffusion FD1 and second the floating diffusion FD2. When the voltages of the first and second floating diffusions FD1 and FD2 are reset, the second transfer transistor TX2 and the overflow transistor OX may be alternately turned on and off, such that an electric charge generated by the second photodiode PD2 may be accumulated in the second floating diffusion FD2. The second reset transistor RX2 may maintain a turned-off state such that the electric charge accumulated in the second floating diffusion FD2 is not leaked. In addition, the first reset transistor RX1 may maintain a turned on state such that the voltage of the first floating diffusion FD1 may be sufficiently reset.

While the electric charge is accumulated in the second floating diffusion FD2, the first transfer transistor TX1 may be turned off, and the first photodiode PD1 may generate an electric charge. The first photodiode PD1 may generate the electric charge during a first exposure time de1, and then, move the electric charge to the first floating diffusion FD1 in response to a turn-on operation of the first transfer transistor TX1.

In the embodiment illustrated in FIG. 10, a controller may obtain a first pixel voltage using the electric charge accumulated in the second floating diffusion FD2 during a first sampling time t1. The controller may generate first raw data using a difference between the first pixel voltage obtained during the first sampling time t1 and the reset voltage obtained during a second sampling time t2. The controller may also generate second raw data using a difference between the reset voltage obtained during the second sampling time t2 and the second pixel voltage obtained during a third sampling time t3. The electric charge of the first photodiode PD1 may be transferred to the first floating diffusion FD1 by the first transfer transistor TX1, turned on between the second sampling time t2 and the third sampling time t3. The controller may use the electric charge of the first floating diffusion FD1 to obtain the second pixel voltage.

In the embodiment illustrated in FIG. 10, a reset voltage for generating the first raw data, and a reset voltage for generating the second raw data may be shared. The controller may not separately detect the reset voltage before acquiring the first pixel voltage, and may generate the first raw data using the reset voltage detected after acquiring the first pixel voltage.

In addition, the controller may expose the first photodiode PD1 during the second exposure time de2, after acquiring the second pixel voltage and resetting the first photodiode PD1. A third pixel voltage may be detected during a fifth time t5 by the electric charge generated in the first photodiode PD1 during the second exposure time de2. The controller may generate third raw data using a difference between the reset voltage and the third pixel voltage obtained during the fourth sampling time t4, prior to the fifth time t5. The reset voltage obtained by the controller during the fourth sampling time t4 may be different from the reset voltage obtained by the controller during the second sampling time t2. The controller may generate a single image using the first raw data, the second raw data, and the third raw data.

Next, referring to FIG. 11, an operation of an image sensor according to an exemplary embodiment of the present inventive concept may start such that a first reset transistor RX1 and a second reset transistor RX2 are turned on to reset voltages of a first floating diffusion FD1 and a second floating diffusion FD2. In the embodiment illustrated in FIG. 11, a controller may obtain a first reset voltage from the first floating diffusion FD1 during a first sampling time t1, after the first reset transistor RX1 is turned off. When the first sampling time t1 elapses, a second transfer transistor TX2 and an overflow transistor OX may be alternately turned on and off, such that an electric charge generated by the second photodiode PD2 is accumulated to the second floating diffusion FD2.

For example, in the embodiment illustrated in FIG. 11, the controller may acquire the first reset voltage, before the second photodiode PD2 is exposed to light to generate an electric charge. The first reset voltage may be stored in a memory connected to the image sensor, and the controller may obtain first raw data by calculating a difference between the first pixel voltage and the first reset voltage acquired during a second sampling time t2. In one example, the first reset voltage may be stored in a line memory.

An exemplary embodiment of the present inventive concept illustrated in FIG. 12 may utilize a second photodiode PD2 for accurately detecting light of a light source in which a flicker phenomenon occurs. Referring to FIG. 12, and similar to the embodiment explained with reference to FIG. 7, after resetting voltages of a first floating diffusion FD1 and a second floating diffusion FD2, an electric charge generated in the second photodiode PD2 may be accumulated in the second floating diffusion FD2 over a plurality of times. At this time, when the electric charge is accumulated in the second floating diffusion FD2, a second reset transistor RX2 may be turned off to separate the first floating diffusion FD1 and the second floating diffusion FD2, and a first photodiode PD1 may be exposed to light to generate an electric charge. For example, the first photodiode PD1 may generate the electric charge during a predetermined exposure time de.

The reset voltage and the pixel voltage detected from the first floating diffusion FD1 in each of a first sampling time t1 and a second sampling time t2 may be used to generate first raw data. The first raw data may be used to accurately detect light of a light source in which a flicker phenomenon occurs. The second reset transistor RX2 may be turned on, during the second sampling time t2 or prior to the second sampling time t2, and the electric charge generated by the second photodiode PD2 and accumulated in the second floating diffusion FD2 may be shared with the first floating diffusion FD1.

In addition, when the second sampling time t2 elapses, the first reset transistor RX1 may be turned on to reset the first floating diffusion FD1, and a reset voltage and a pixel voltage may be detected at a third sampling time t3 and a fourth sampling time t4, respectively. The pixel voltage detected at the fourth sampling time t4 may be a voltage of the first floating diffusion FD1 corresponding to an amount of electric charge accumulated in the first photodiode PD1 during the exposure time de. An image sensor may generate the second raw data by calculating a difference between the reset voltage and the pixel voltage detected at the third sampling time t3 and the fourth sampling time t4, respectively. The second raw data may be used to generate a general image. In an example, when the image sensor generates the first raw data once, the second raw data may be generated a plurality of times. Therefore, image frame rate degradation may be significantly decreased due to the generation of the first raw data.

In addition, the embodiment illustrated in FIG. 12 may utilize the second photodiode PD2 to increase the dynamic range of the image. In this case, the first raw data may be image data generated during a short exposure time, and the second raw data may be image data generated during a long exposure time. A controller of the image sensor may increase the dynamic range of the image by generating a single image using the first raw data and the second raw data.

Figure 13:
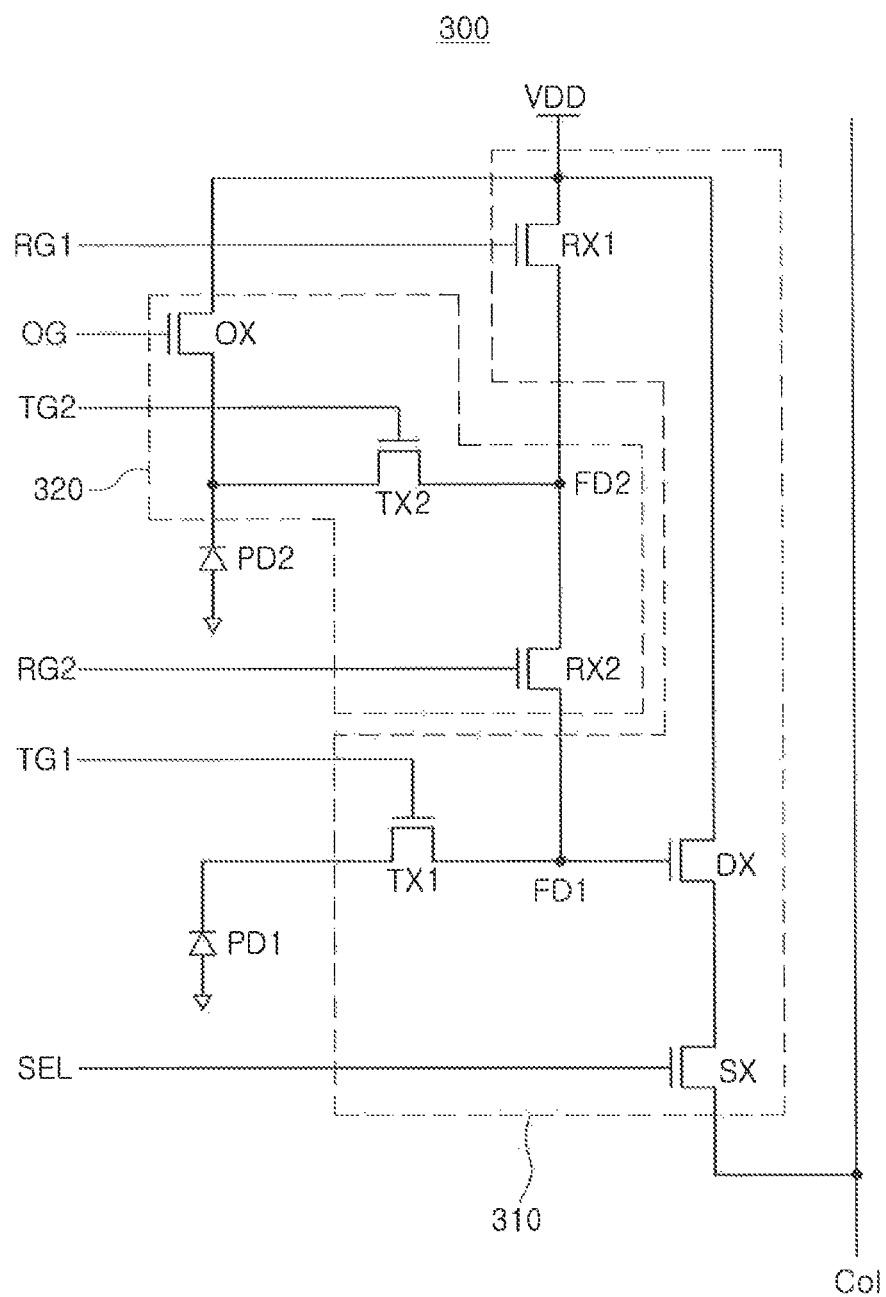
FIG. 13 is a circuit diagram illustrating a pixel circuit included in an image sensor according to an exemplary embodiment of the present inventive concept.

FIG. 13 is a circuit diagram illustrating a pixel circuit included in an image sensor according to an exemplary embodiment of the present inventive concept.

A pixel circuit 300 according to an exemplary embodiment of the present inventive concept illustrated in FIG. 13 may include a first pixel circuit 310 and a second pixel circuit 320. The first pixel circuit 310 may output an electrical signal using an electric charge generated by a first photodiode PD1, and the second pixel circuit 320 may output an electrical signal using an electric charge generated by a second photodiode PD2. A configuration of transistors included in each of the first pixel circuit 310 and the second pixel circuit 320 may be similar to the embodiment illustrated in FIG. 6.

Unlike the embodiment illustrated in FIG. 6, in the embodiment illustrated in FIG. 13, a second reset transistor RX2 may be connected between a first floating diffusion FD1 and a second floating diffusion FD2. For example, the second floating diffusion FD2 may be connected to a first reset transistor RX1, the second reset transistor RX2, and a second transfer transistor TX2. Hereinafter, an operation of the pixel circuit 300 according to the embodiment illustrated in FIG. 13 will be described with reference to FIGS. 14 to 17.

FIGS. 14 to 17 are views illustrating an operation of an image sensor according to an exemplary embodiment of the present inventive concept.

Figure 14:
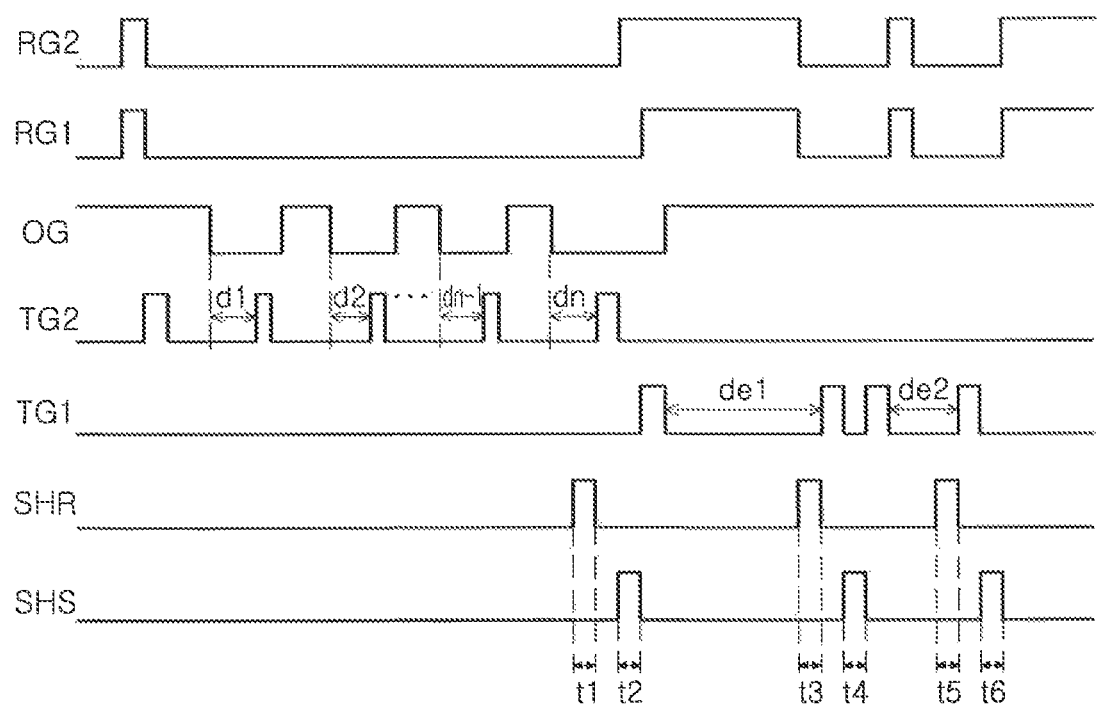
FIGS. 14, 15, 16 and 17 are views illustrating an operation of an image sensor according to an exemplary embodiment of the present inventive concept.

According to the embodiments illustrated in FIGS. 14 to 17, a dynamic range of an image sensor may be increased, and an image accurately representing an external light source, in which a flicker phenomenon occurs, may be generated. Referring to FIG. 14, an operation of the image sensor according to an exemplary embodiment of the present inventive concept may start such that a first reset transistor RX1 and a second reset transistor RX2 are turned on to reset voltages of a first floating diffusion FD1 and a second floating diffusion FD2. The first reset transistor RX1 may be turned on by a first reset control signal RG1, and the second reset transistor RX2 may be turned on by a second reset control signal RG2.

When the voltages of the first and second floating diffusions FD1 and FD2 are reset, a second transfer transistor TX2 and an overflow transistor OX may be alternately turned on and off, such that an electric charge generated by the second photodiode PD2 is accumulated in the second floating diffusion FD2. The overflow transistor OX may be turned on and off using an overflow control signal OG, and the second transfer transistor TX2 may be turned on and off by a second transfer control signal TG2. Since the second floating diffusion FD2 is disposed between the first reset transistor RX1 and the second reset transistor RX2, the first reset transistor RX1 and the second reset transistor RX2 may be kept in a turned-off state, while the electric charge is accumulated in the second floating diffusion FD2.

To generate first raw data corresponding to an amount of the electric charge generated by the second photodiode PD2, the image sensor may detect a first reset voltage and a first pixel voltage at a first sampling time t1 and a second sampling time t2, respectively. Each of the first sampling time t1 and the second sampling time t2 may occur before and after the electric charge generated by the second photodiode PD2 is accumulated in the second floating diffusion FD2 at $n^{th}$ time. In addition, since the electric charge accumulated in the second floating diffusion FD2 is to be converted to the voltage in a driving transistor DX through the first floating diffusion FD1, the second reset transistor RX2 may be turned on during the second sampling time t2.

In the pixel circuit 300 according to the embodiment illustrated in FIG. 13, the second floating diffusion FD2 may be a node between the first reset transistor RX1 and the second reset transistor RX2. Therefore, while the electric charge generated by the second photodiode PD2 is accumulated in the second floating diffusion FD2 over a plurality of times, the first reset transistor RX1 can maintain a turned-off state and the first photodiode PD1 may not be exposed to light to generate an electric charge. After the second sampling time t2 elapses, the first transfer transistor TX1, the first reset transistor RX1, and the second reset transistor RX2 may be turned on together to reset the first photodiode PD1 and the first floating diffusion FD1.

When the first photodiode PD1 and the first floating diffusion FD1 are reset, the image sensor may turn the first transfer transistor TX1 off, and expose the first photodiode PD1 to light during a first exposure time de1 to generate an electric charge. Before the first exposure time de1 ends, the image sensor may turn the first and second reset transistors RX1 and RX2 off, and detect the second reset voltage from the first floating diffusion FD1. The second reset voltage may be detected during a third sampling time t3 in which the reset voltage detecting signal SHR has a high logic value. For example, the first exposure time de1 may be a time longer than the sum of the plurality of times (d1, d2, ..., dn−1, dn).

When the first exposure time de1 elapses, the image sensor may turn the first transfer transistor TX1 on to transfer the electric charge accumulated in the first photodiode PD1 to the first floating diffusion FD1. The image sensor may detect a voltage of the first floating diffusion FD1 as a second pixel voltage during a fourth sampling time t4, after the first transfer transistor TX1 is turned off. The image sensor may generate second raw data for generating an image by calculating a difference between the second reset voltage and the second pixel voltage detected at each of the third sampling time t3 and the fourth sampling time t4.

When the fourth sampling time t4 ends, the image sensor may expose the first photodiode PD1 to light during a second exposure time de2, and detect a third reset voltage and a third pixel voltage at a fifth sampling time t5 and a sixth sampling time t6, respectively. The second exposure time de2 may be shorter than the sum of the plurality of times (d1, d2, ..., dn−1, dn). The image sensor may generate third raw data necessary for generating an image by calculating a difference between the third reset voltage and the third pixel voltage detected at the fifth sampling time t5 and the sixth sampling time t6, respectively.

In an exemplary embodiment of the present inventive concept, the image sensor may combine the first to third raw data obtained in each of the plurality of pixels to obtain a single image. As described above, the first to third raw data may be data obtained by exposing the first and second photodiodes PD1 and PD2 to light during different exposure times. Therefore, the first to third raw data may be combined to obtain a single image, to increase a dynamic range characteristic of the image.

In addition, the first raw data may be used to accurately reflect a light source such as an LED, etc., in which a flicker phenomenon occurs, in an image. In an exemplary embodiment of the present inventive concept, the second photodiode PD2 may be prevented from being saturated due to the overflow transistor OX, such that light of a light source such as an LED may be accurately detected even when the surrounding illuminance is relatively low. In addition, the second photodiode PD2 may be used for detecting light of a light source such as an LED in one pixel, and thus, general image data may be generated using the first photodiode PD1. Therefore, the frame rate does not have to be sacrificed to detect the light of the image.

Figure 15:
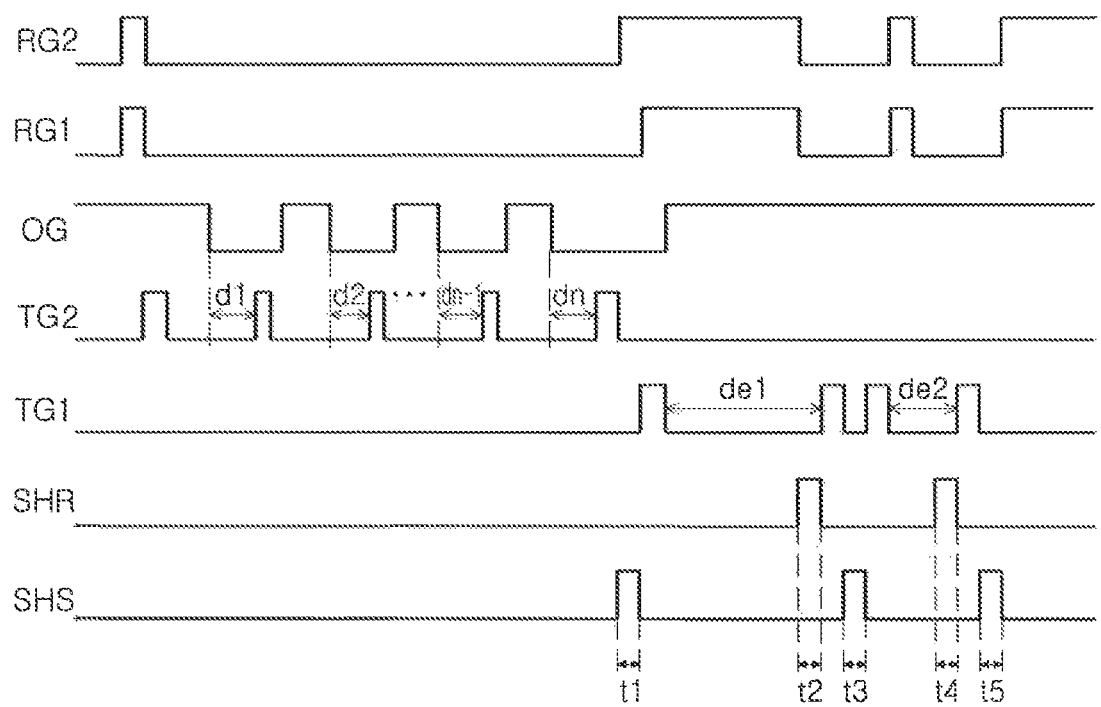

Unlike the embodiment illustrated in FIG. 14, in an exemplary embodiment of the present inventive concept illustrated in FIG. 15, a first reset voltage may not be detected, when an electric charge of a second photodiode PD2 is accumulated in a second floating diffusion FD2. A controller may obtain a first pixel voltage during a first sampling time t1, after the electric charge generated by the second photodiode PD2 is accumulated at an $n^{th}$ time in the second floating diffusion FD2. The controller may calculate a difference between a reset voltage obtained during a second sampling time t2 and the first pixel voltage to obtain first raw data.

During a third sampling time t3, the controller may also obtain the second pixel voltage by an electric charge generated in a first photodiode PD1 during a first exposure time de1. The controller may calculate a difference between the reset voltage obtained during the second sampling time t2 and the second pixel voltage to obtain second raw data. For example, in the embodiment illustrated in FIG. 15, there may be one reset voltage used to acquire each of the first raw data and the second raw data.

Figure 16:
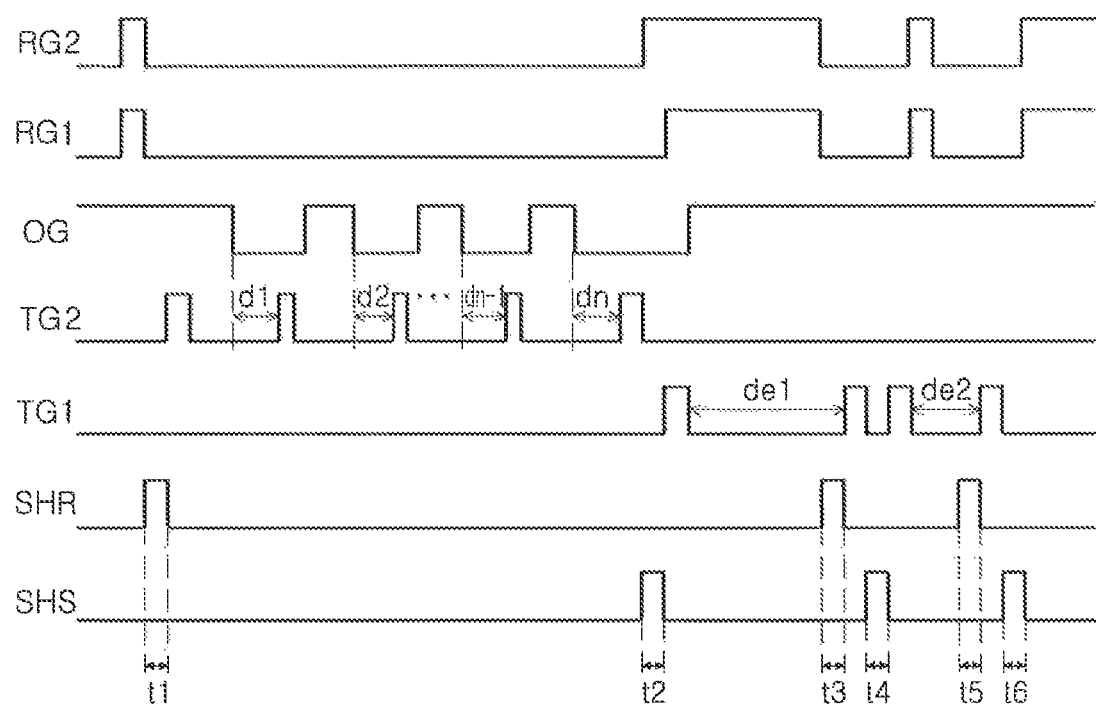

In an exemplary embodiment of the present inventive concept illustrated in FIG. 16, unlike the embodiment illustrated in FIG. 14, during a first sampling time t1, before an electric charge of a second photodiode PD2 is accumulated in the second floating diffusion FD2, a controller may obtain a first reset voltage. The controller may store the first reset voltage obtained during the first sampling time t1 in a separate memory, and then, calculate a difference between a first pixel voltage obtained during a second sampling time t2 and the first reset voltage to generate first raw data. The method of generating second raw data and third raw data may be the same as described with reference to FIGS. 14 and 15.

Figure 17:
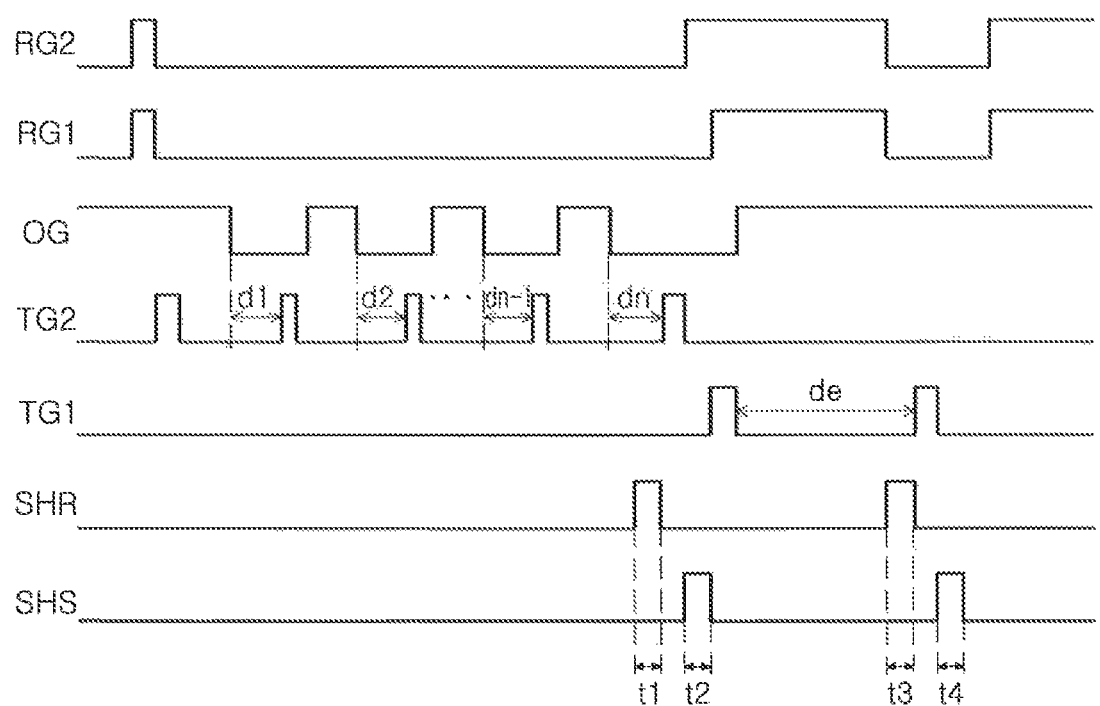

Next, an exemplary embodiment of the present inventive concept illustrated in FIG. 17 may use a second photodiode PD2 only to accurately detecting light of a light source in which a flicker phenomenon occurs. Referring to FIG. 17, after voltages of a first floating diffusion FD1 and a second floating diffusion FD2 are reset, an electric charge generated by a second photodiode PD2 may be accumulated in the second floating diffusion FD2 over a plurality of times. The electric charge accumulated in the second floating diffusion FD2 may be shared by the first floating diffusion FD1, as a second reset transistor RX2 is turned on.

A first reset voltage and a first pixel voltage detected from the first floating diffusion FD1 at each of the first sampling time t1 and the second sampling time t2 may be used to generate first raw data. The first raw data may be used to accurately detect light of a light source in which a flicker phenomenon occurs.

In addition, when the second sampling time t2 ends, a first reset transistor RX1 and a second reset transistor RX2 may be turned on to reset voltages of the first floating diffusion FD1 and the second floating diffusion FD2. In this case, a reset voltage and a pixel voltage may be detected at a third sampling time t3 and a fourth sampling time t4, respectively. The pixel voltage detected at the fourth sampling time t4 may be a voltage of the first floating diffusion FD1 corresponding to an amount of an electric charge accumulated in the first photodiode PD1 during an exposure time de. The image sensor may generate second raw data by calculating a difference between the reset voltage and the pixel voltage detected at the third sampling time t3 and the fourth sampling time t4, respectively. The second raw data may be used to generate general image data. As an example, when the image sensor generates the first raw data once, the second raw data may be generated over a plurality of times. Therefore, image frame rate degradation may be significantly decreased due to the generation of the first raw data.

Figure 18:
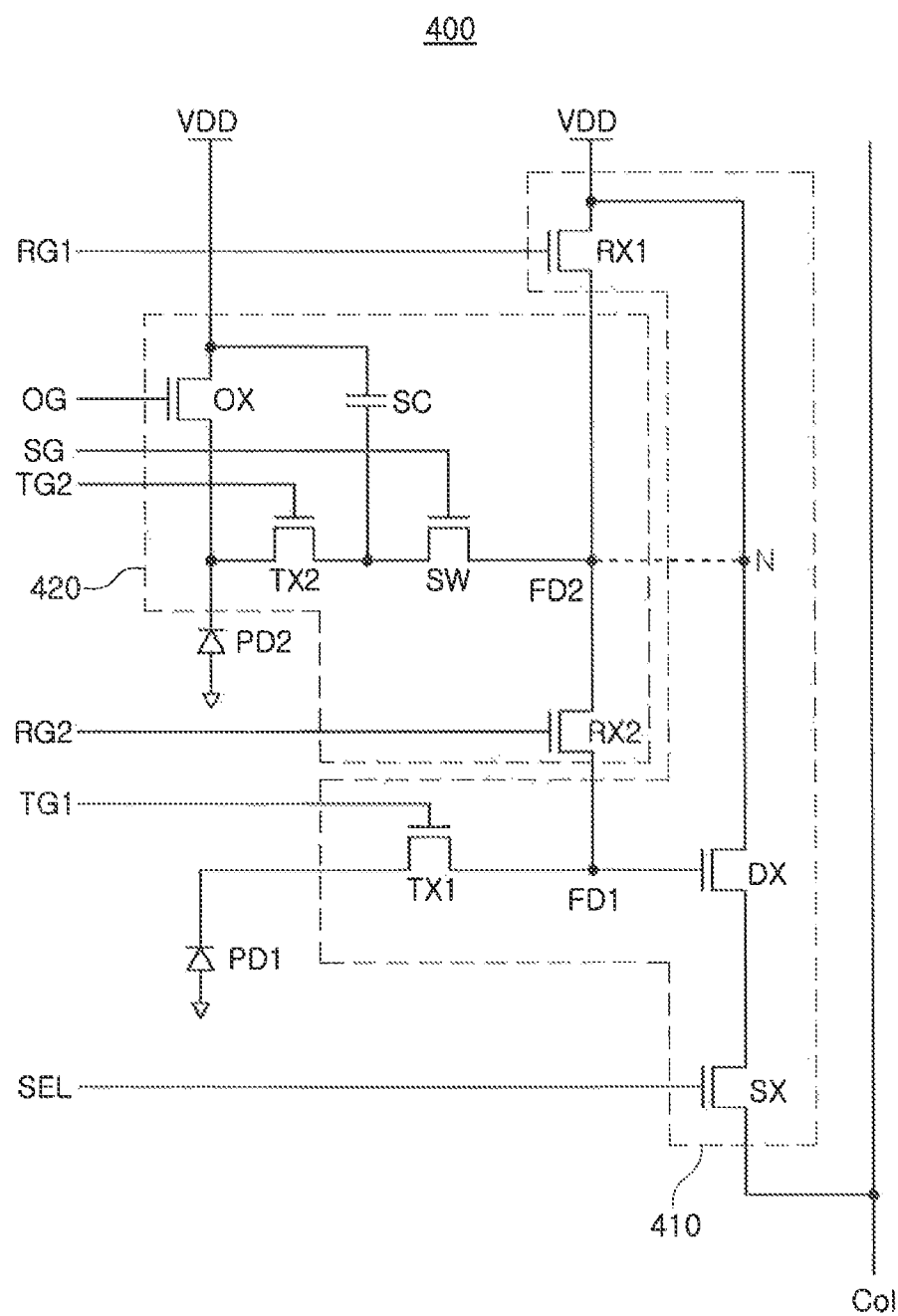
FIG. 18 is a circuit diagram illustrating a pixel circuit included in an image sensor according to an exemplary embodiment of the present inventive concept.

FIG. 18 is a circuit diagram illustrating a pixel circuit included in an image sensor according to an exemplary embodiment of the present inventive concept.

Referring to FIG. 18, a pixel circuit 400 according to an exemplary embodiment of the present inventive concept may include a first pixel circuit 410 and a second pixel circuit 420. The first pixel circuit 410 may process an electric charge generated in a first photodiode PD1, and the second pixel circuit 420 may process an electric charge generated in a second photodiode PD2.

The first pixel circuit 410 may include a first floating diffusion FD1, a first reset transistor RX1, a first transfer transistor TX1, a driving transistor DX, a selection transistor SX, and the like. The second pixel circuit 420 may include a second floating diffusion FD2, a second reset transistor RX2, a second transfer transistor TX2, an overflow transistor OX, a storage capacitor SC, a switch element SW, and the like. The operation of the active elements included in each of the first pixel circuit 410 and the second pixel circuit 420 may be controlled by a controller included in the image sensor. The storage capacitor SC may be connected to a supply or pixel voltage VDD.

In operation of the pixel circuit 400, the first pixel circuit 410 and the second pixel circuit 420 may share at least a portion of the circuit elements. For example, the second pixel circuit 420 may use the driving transistor DX and the selection transistor SX to output a pixel voltage corresponding to an electric charge generated by the second photodiode PD2. The first pixel circuit 410 also may use the second reset transistor RX2 and the second floating diffusion FD2 to control an electric charge generated by the first photodiode PD1 or a capacitance of the pixel.

In the embodiment illustrated in FIG. 18, the second pixel circuit 420 may include a storage capacitor SC for storing the electric charge generated by the second photodiode PD2. The storage capacitor SC may be a metal-insulator-metal (MIM) capacitor or an active capacitor. The storage capacitor SC may store an electric charge in response to an amount of the electric charge generated in the second photodiode PD2 and an operation of the second transfer transistor TX2. The switch element SW may be connected between the storage capacitor SC and the second floating diffusion FD2, and the electric charge of the storage capacitor SC may be transferred to the second floating diffusion FD2 according to on/off operation of the switch element SW. An output of the second circuit 420 may be connected to a node N between the driving transistor DX and the first reset transistor RX1, for example. A channel of the first transfer transistor TX1, the switch element SW or the second transfer transistor TX2 includes indium gallium zinc oxide (IGZO), for example.

The second photodiode PD2 may have a small light receiving area as compared with the first photodiode PD1, and therefore may be saturated more easily. In the embodiment illustrated in FIG. 18, the electric charge of the second photodiode PD2 may be removed by using the overflow transistor OX, or the saturation of the second photodiode PD2 may be prevented by transferring the electric charge of the second photodiode PD2 to the storage capacitor SC. The image sensor including the pixel circuit 400 according to the embodiment illustrated in FIG. 18 may use the electric charge generated in each of the first photodiode PD1 and the second photodiode PD2 to increase the dynamic range, and thus, may accurately capture a light source such as an LED, in which a flicker phenomenon occurs.

Figure 19:
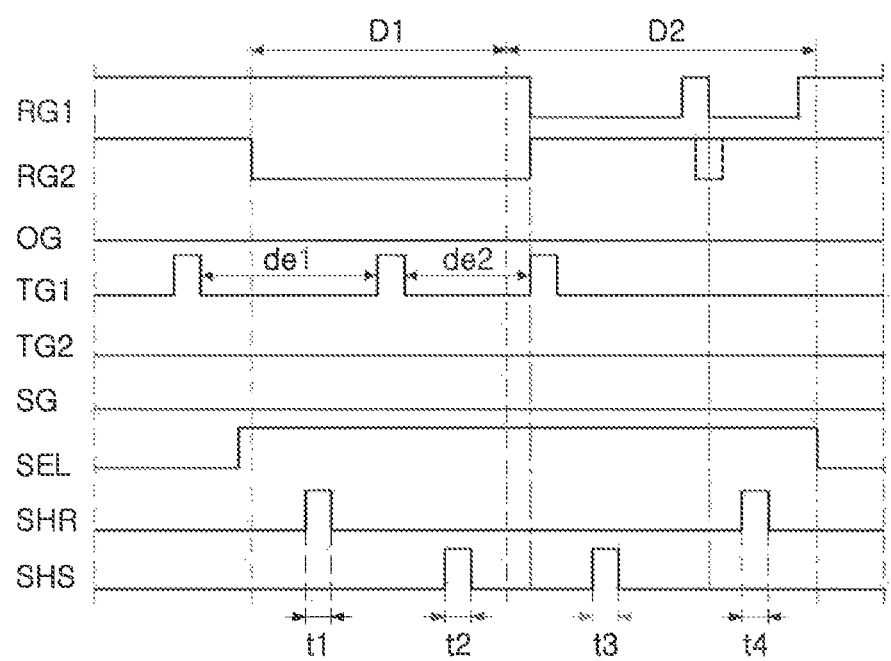
FIGS. 19, 20A and 20B are views illustrating an operation of an image sensor according to an exemplary embodiment of the present inventive concept.
Figure 20A:
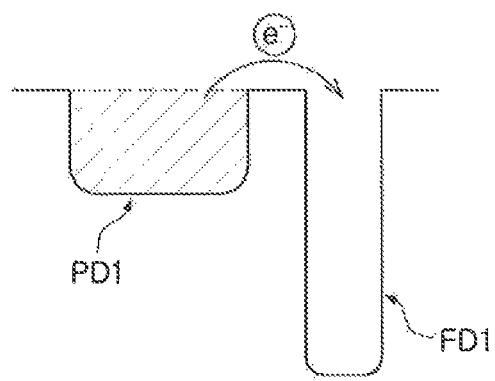
Figure 20B:
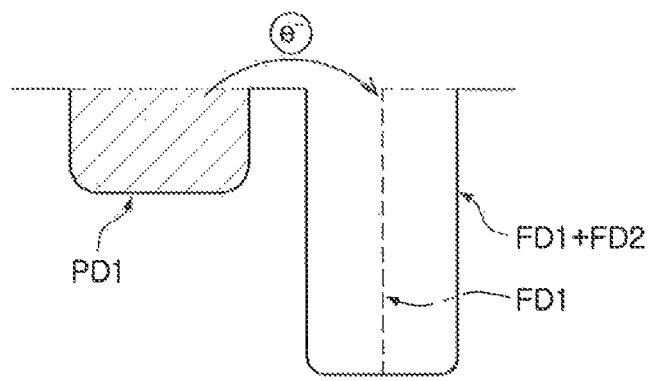

FIGS. 19, 20A and 20B are views illustrating an operation of an image sensor according to an exemplary embodiment of the present inventive concept.

First, FIG. 19 may be a timing diagram for explaining the operation of the image sensor having the pixel circuit 400 according to the embodiment illustrated in FIG. 18. Referring to FIG. 19, the operation of the image sensor according to an exemplary embodiment of the present inventive concept may start, such that the first and second reset transistors RX1 and RX2 are turned on to reset voltages of the first and second floating diffusions FD1 and FD2. The first reset transistor RX1 may be turned on by a first reset control signal RG1, and the second reset transistor RX2 may be turned on by a second reset control signal RG2. At this time, the electric charge of the first photodiode PD1 may be removed by turning on the first transfer transistor TX1.

After the first transfer transistor TX1 is turned off, the first photodiode PD1 may be exposed to light during the first exposure time de1. Then, the selection transistor SX may be turned on by the selection control signal SEL to detect the reset voltage and the pixel voltage. When the selection transistor SX is turned on, the first reset voltage and the first pixel voltage may be sequentially detected during the first time D1. In one example, the sampling circuit of the controller may detect the first reset voltage during a first sampling time t1 at which a reset voltage detection signal SHR has a high logic value. The controller may also detect the first pixel voltage during a second sampling time t2 at which a pixel voltage detection signal SHS has a high logic value. The first transfer transistor TX1 may be turned on and off between the first sampling time t1 and the second sampling time t2, such that an electric charge at the first photodiode PD1 may move to the first floating diffusion FD1 during the first exposure time de1.

In the embodiment illustrated in FIG. 19, during the second time D2 after the first time D1, the image sensor may detect the pixel voltage and the reset voltage from the first photodiode PD1 once again. As illustrated in FIG. 19, when the second time D2 starts, the first reset transistor RX1 is turned off, and the second reset transistor RX2 is turned on. Therefore, the sum of turned on capacitances of the first floating diffusion FD1, the second floating diffusion FD2, and the second reset transistor RX2 may correspond to a floating diffusion of the first photodiode PD1. As a result, in the second time D2, the electric charge of the first photodiode PD1 may be stored in the floating diffusion having a larger area than a floating diffusion in the first time D1. Therefore, the conversion gain of the pixel during the second time D2 may be less than the conversion gain of the pixel during the first time D1.

The sampling circuit of the image sensor may detect the second pixel voltage and the second reset voltage at each of the third sampling time t3 and the fourth sampling time t4. For example, at the second time D2, the pixel voltage may be detected before the reset voltage. The second pixel voltage may correspond to the electric charge generated in the first photodiode PD1 during the first exposure time de1 and the second exposure time de2. The second exposure time de2 may be shorter than the first exposure time de1.

When the second pixel voltage is detected, the controller may turn the first reset transistor RX1 on and off to reset the voltages of the first floating diffusion FD1 and the second floating diffusion FD2, and may then detect the second reset voltage. In this case, to compensate for the coupling effect, the second reset transistor RX2 may be turned off when the first reset transistor RX1 is turned on. Referring to FIG. 19, at least a portion of the turn-on time of the first reset transistor RX1 and the turn-off time of the second reset transistor RX2 may overlap each other within the second time D2.

In the embodiment illustrated in FIG. 19, image data may be generated using the reset voltage and the pixel voltage detected under conversion gain conditions different from each other. Therefore, saturation of the first photodiode PD1 and the first floating diffusion FD1 may be prevented, and an optimized image may be provided to the user, irrespective of the illuminance of the environment in which the image sensor operates. In general, the capacitance of the first photodiode PD1 may be determined in accordance with the high illuminance condition that can easily saturate the first photodiode PD1. In the embodiment illustrated in FIG. 19, before reading the pixel voltage and the reset voltage at the second time D2, the second reset transistor RX2 may be turned on to connect the first floating diffusion FD1 and the second floating diffusion FD2, and not to saturate the first floating diffusion FD1 by the electric charge of the first photodiode PD1. Therefore, the electric charge generated in the first photodiode PD1 may be sufficiently accumulated in the first floating diffusion FD1 and the second floating diffusion FD2. In addition, an image may be generated by using amounts of the electric charge more than in the first photodiode PD1, and thus, the saturation of the pixel may be prevented. In addition, in the operation according to the embodiment illustrated in FIG. 19, the second photodiode PD2 may not be used.

FIGS. 20A and 20B are provided to explain operations of a first photodiode PD1 and a floating diffusion. FIGS. 20A and 20B are views illustrating first and second photodiodes PD1 and PD2, at a first time D1 having a high conversion gain condition and at a second time D2 having a low conversion gain condition, respectively.

First, referring to FIG. 20A, an electric charge generated in the first photodiode PD1 may be transferred to the first floating diffusion FD1 in the first time D1. Since the second reset transistor RX2 is turned off during the first time D1, the electric charge may be accumulated only in the first floating diffusion FD1. A capacitance of the first photodiode PD1 may be determined in consideration of a high conversion gain condition as illustrated in FIG. 20A. Therefore, a capacitance of the first floating diffusion FD1 may be similar to a capacitance of the first photodiode PD1.

Next, referring to FIG. 20B, at the second time D2, the second reset transistor RX2 may be turned on, and then, a turned on capacitance of the reset transistor RX2, as well as the first floating diffusion FD1 and the second floating diffusion FD2, may be used as a floating diffusion. Therefore, amounts of electric charge exceeding the capacitance of the first photodiode PD1 may be accumulated in the floating diffusion, and reflected in the pixel voltage through the driving transistor DX. For example, according to the embodiment described with reference to FIGS. 19, 20A and 20B, image data may be generated using amounts of an electric charge that are more than the capacitance of the first photodiode PD1. Therefore, saturation of pixels may be prevented, and the quality of the image data may be increased at the same time.

FIGS. 21 to 27 are views illustrating an operation of an image sensor according to an exemplary embodiment of the present inventive concept. FIGS. 21 to 27 are provided to illustrate different modes of operation of the image sensor. The image sensor may have a pixel circuit 400 according to the embodiment illustrated in FIG. 18.

Figure 21:
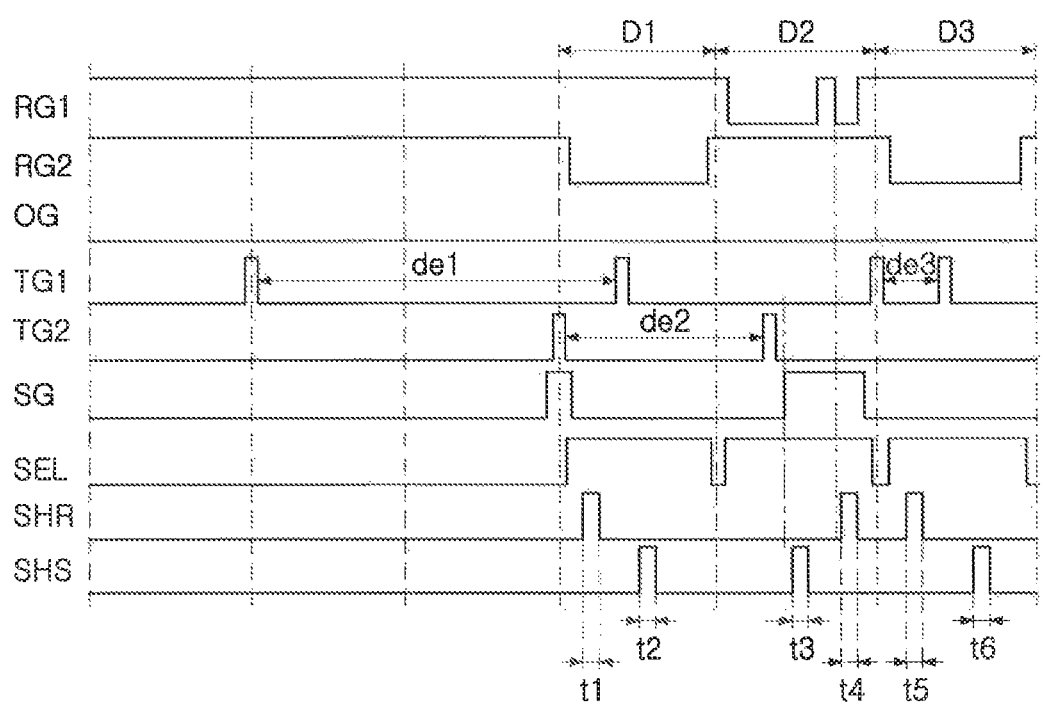
FIGS. 21, 22, 23, 24, 25, 26 and 27 are views illustrating an operation of an image sensor according to an exemplary embodiment of the present inventive concept.
Figure 22:
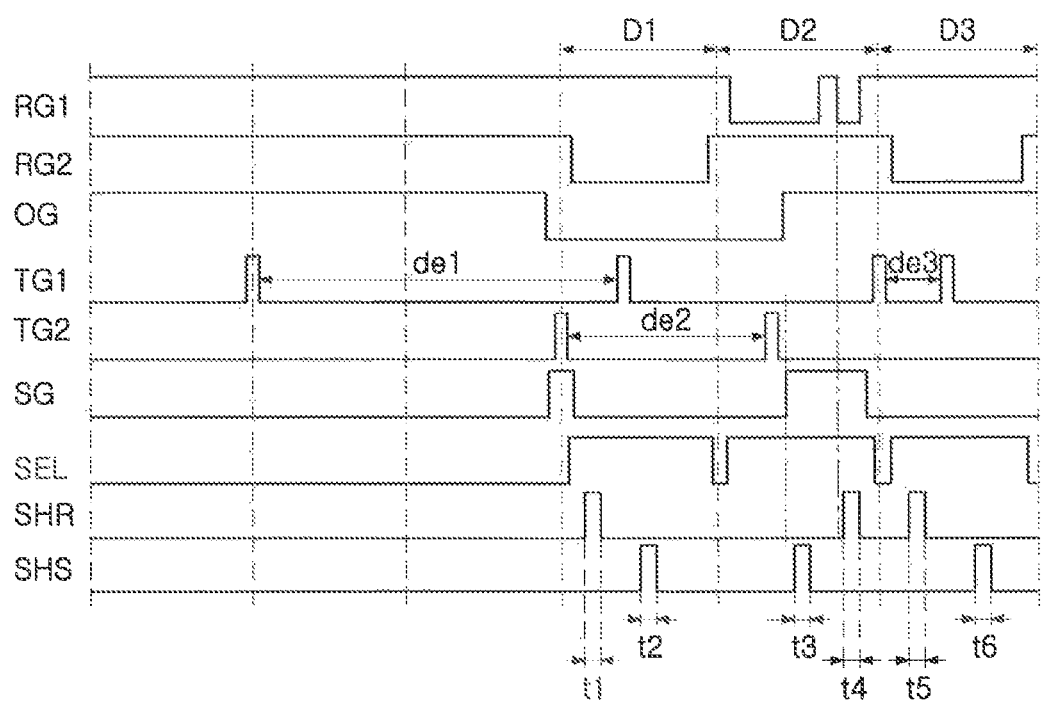

FIGS. 21 and 22 are views illustrating an operation mode in which the dynamic range of the image sensor may be increased by using the first photodiode PD1 and the second photodiode PD2. Referring to FIG. 21, in the operation mode for increasing the dynamic range, the first reset transistor RX1 and the second reset transistor RX2 may be turned on to reset voltages of the first floating diffusion FD1 and the second floating diffusion FD2. In addition, while the first reset transistor RX1 and the second reset transistor RX2 are turned on, the first transfer transistor TX1 may be turned on and off to remove the electric charge from the first photodiode PD1. The first exposure time de1 may start, when the first transfer transistor TX1 is turned off.

When the first exposure time de1 elapses and the first transfer transistor TX1 is turned on, the electric charge generated in the first photodiode PD1 during the first exposure time de1 may be transferred to the first floating diffusion FD1. A sampling circuit of the controller may detect the first reset voltage and the first pixel voltage in each of the first sampling time t1 and the second sampling time t2 of the first time D1. The first sampling time t1 may be a time before the electric charge of the first photodiode PD1 is transferred to the first floating diffusion FD1, and the second sampling time t2 may be a time after the electric charge of the first photodiode PD1 is transferred to the first floating diffusion FD1. At least a portion of the first time D1 including the first sampling time t1 and the second sampling time t2 may overlap the first exposure time de1. The controller may generate first raw data for generating the image data using the difference between the first reset voltage and the first pixel voltage.

The controller may separate the first floating diffusion FD1 and the second floating diffusion FD2 by turning off the second reset transistor RX2 during the first time D1. Therefore, the electric charge of the first photodiode PD1 may be accumulated only in the first floating diffusion FD1. When the first time D1 elapses, the controller may turn on the second reset transistor RX2 to reset voltage of the first floating diffusion FD1.

Referring to FIG. 21, a second exposure time de2 may start during the first exposure time de1. The second exposure time de2 may start, such that a second transfer transistor TX2 and a switch element SW are turned on and off to reset a second floating diffusion FD2, a storage capacitor SC, and a second photodiode PD2. The second exposure time de2 may be shorter than the first exposure time de1.

A second pixel voltage corresponding to an electric charge generated by the second photodiode PD2 during the second exposure time de2 may be detected in the second time D2. To detect the second pixel voltage, a first reset transistor RX1 may be turned off to separate the second floating diffusion FD2 from a power supply node. Further, a second reset transistor RX2 may be turned on to connect a first floating diffusion FD1 and the second floating diffusion FD2.

When the second exposure time de2 elapses, the second transfer transistor TX2 and the switch element SW may be turned on to transfer the electric charge of the second photodiode PD2 to the first floating diffusion FD1 and the second floating diffusion FD2. Then, during a third sampling time t3 in the second time D2, a sampling circuit may detect the second pixel voltage.

When the second pixel voltage is detected, a controller of an image sensor may turn on the first reset transistor RX1 to reset voltages of the first floating diffusion FD1 and the second floating diffusion FD2, and may detect a second reset voltage during a fourth sampling time t4. The controller may calculate the difference between the second pixel voltage and the second reset voltage to generate second raw data. The first reset transistor RX1 may be turned off during the fourth sampling time t4 to detect the second reset voltage, and may be turned back on after the second reset voltage is detected.

When the second reset voltage is detected, the controller may expose a first photodiode PD1 to light during a third exposure time de3. The third exposure time de3 may be shorter than the second exposure time de2, and the controller may turn on the first reset transistor RX1, the second reset transistor RX2, and the first transfer transistor TX1 to reset the voltage of the first floating diffusion FD1, before the start of the third exposure time de3.

The controller may obtain the third reset voltage during a fifth sampling time t5 in the third exposure time de3. When the third exposure time de3 ends, the controller may transfer the electric charge of the first photodiode PD1 to the first floating diffusion FD1, and may then acquire a third pixel voltage during a sixth sampling time t6. During a third time D3 in which the controller acquires the third reset voltage and the third pixel voltage, the second reset transistor RX2 may be turned off to separate the first floating diffusion FD1 and the second floating diffusion FD2. The controller may calculate the difference between the third reset voltage and the third pixel voltage to obtain third raw data.

The controller may generate image data using the first raw data, the second raw data, and the third raw data. Since the second exposure time de2 is shorter than the first exposure time de1, but longer than the third exposure time de3, the first to third raw data may correspond to an electric charge generated during exposure times different from each other. The controller may combine the first to third raw data to generate the image data, such that a dynamic range of the image sensor is increased and quality of the image is increased.

Referring to FIG. 22, a portion of operations may be the same as the embodiment illustrated in FIG. 21, but an operation of an overflow transistor OX may be different. A default state of the overflow transistor OX in the embodiment illustrated in FIG. 21 may be off. A default state of the overflow transistor OX in the embodiment illustrated in FIG. 22 may be on. In the embodiment illustrated in FIG. 22, the overflow transistor OX may maintain a turn-on state by default, and may be turned off during a portion of time corresponding to the second exposure time de2. The overflow transistor OX may be turned off during at least the second exposure time de2, since the second photodiode PD2 is exposed to light to generate an electric charge during the second exposure time de2.

Next, the operation of the image sensor according to various exemplary embodiments of the present inventive concept will be described with reference to FIGS. 23 to 27. In embodiments illustrated in FIGS. 23 to 27, an image sensor may increase dynamic range, and may generate an image that accurately captures an external light source in which the flicker phenomenon appears, using a second photodiode PD2.

Figure 23:
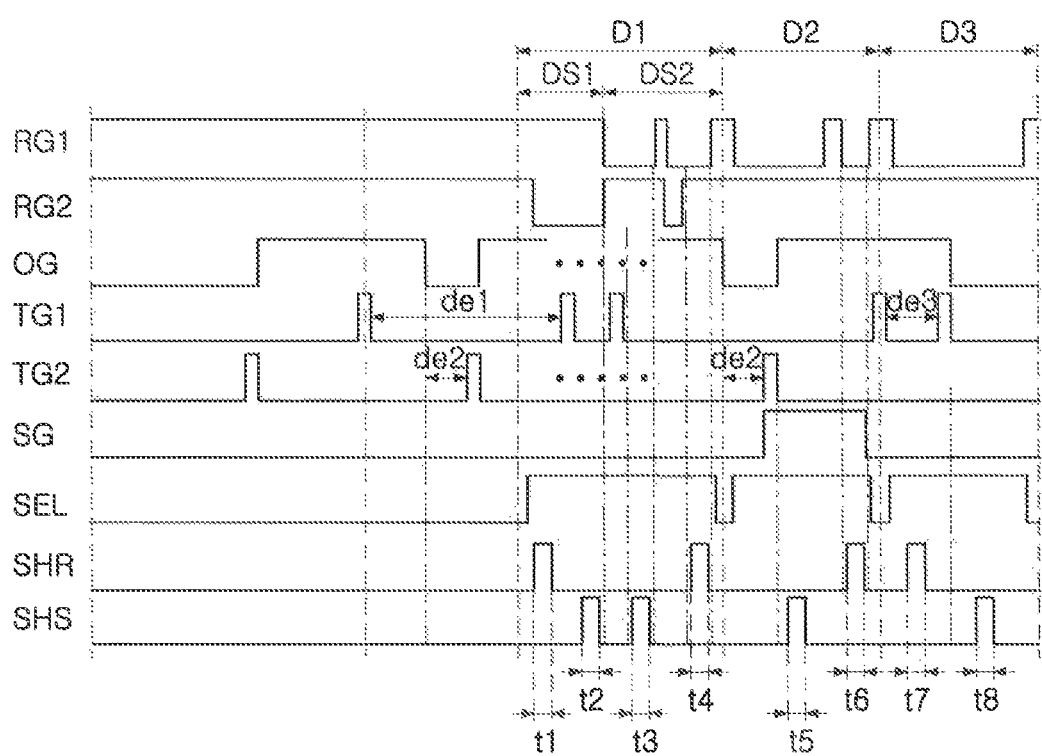

Referring to FIG. 23, a controller of an image sensor may turn on a first reset transistor RX1 and a second reset transistor RX2 to reset voltages of a first floating diffusion FD1 and a second floating diffusion FD2. The controller may also control a second photodiode PD2 to generate an electric charge by alternately turning an overflow transistor OX and a second transfer transistor TX2 on and off. The second photodiode PD2 may generate the electric charge during a second exposure time de2 over a plurality of times. A switch element SW may be turned off, while the overflow transistor OX and the second transfer transistor TX2 are alternately turned on and off. Therefore, the electric charge of the second photodiode PD2 may not be transferred to the second floating diffusion FD2, and may be stored in a storage capacitor SC.

While the second photodiode PD2 generates an electric charge, the controller may perform a shutter operation for the first photodiode PD1 by turning the first transfer transistor TX1 on and off. Since the switch element SW is turned off, the shutter operation for the first photodiode PD1 may not affect the second photodiode PD2. When the shutter operation is completed, the first photodiode PD1 may generate an electric charge during a first exposure time de1.

In the embodiment illustrated in FIG. 23, the controller may control the second reset transistor RX2 to change an area of a floating diffusion, and may detect a first sub-pixel voltage and a second sub-pixel voltage corresponding to the electric charge of the first photodiode PD1. In other words, the controller may detect a pixel voltage corresponding to the electric charge of the first photodiode PD1 over two periods of time. Therefore, the first sub-pixel voltage and the second sub-pixel voltage may be detected under conversion gain conditions different from each other. By changing the area of the floating diffusion to detect the first sub-pixel voltage and the second sub-pixel voltage, a quality of an image may not be deteriorated due to the saturation of the first photodiode PD1 under a high illuminance condition. The controller may obtain the first sub-pixel voltage and the second sub-pixel voltage in each of a first sub-time DS1 and a second sub-time DS2 of a first time D1.

For example, when the first sub-time DS1 starts during the first exposure time de1, the controller may turn off the second reset transistor RX2 to separate the first floating diffusion FD1 from the second floating diffusion FD2, and obtain a first sub-reset voltage from the first floating diffusion FD1 during a first sampling time t1. When the first sampling time t1 elapses, the controller may turn the first transfer transistor TX1 on to transfer an electric charge generated by the first photodiode PD1 during the first exposure time de1 to the first floating diffusion FD1, and may detect the first sub-pixel voltage during a second sampling time t2.

Next, when the second sub-time DS2 starts, the controller may turn the first reset transistor RX1 off and turn the second reset transistor RX2 on to increase an area of the floating diffusion of the pixel and to lower the conversion gain. Therefore, a larger amount of an electric charge may be stored in the floating diffusion of the pixel. The controller may turn on the first transfer transistor TX1 to store the electric charge of the first photodiode PD1 in the first floating diffusion FD1, the second floating diffusion FD2, the turned on second reset transistor RX2, and the like.

The controller may detect the second sub-pixel voltage during a third sampling time t3, and detect a second sub-reset voltage during a subsequent fourth sampling time t4. The first reset transistor RX1 may be turned on between the third sampling time t3 and the fourth sampling time t4 such that voltages of the first floating diffusion FD1 and the second floating diffusion FD2 are reset. As described above with reference to FIG. 19, an operation of temporarily turning off the second reset transistor RX2 may be further performed to offset a coupling effect.

The controller may generate first raw data using a difference between the first sub-reset voltage and the first sub-pixel voltage and a difference between the second sub-reset voltage and the second sub-pixel voltage. The first raw data may be image data corresponding to an electric charge generated by the first photodiode PD1 during the longest first exposure time de1.

At a second time D2, subsequent to the first time D1, the controller may detect a second pixel voltage corresponding to the electric charge of the second photodiode PD2. At the second time D2, the second reset transistor RX2 may be turned on and the first reset transistor RX1 may be turned off, to connect the first floating diffusion FD1 and the second floating diffusion FD2. An electric charge generated by the second photodiode PD2 during the second exposure time de2 and stored in the storage capacitor SC may be transferred to the first floating diffusion FD1 and the second floating diffusion FD2 in response to a turn-on operation of the switch element SW. A portion of the electric charge generated by the second photodiode PD2 may be stored in the turned on second reset transistor RX2. For example, the switch element SW may be turned on after the last second exposure time de2 has elapsed. In the embodiment illustrated in FIG. 23, although the switch element SW is turned on, together with the second transfer transistor TX2, the switch element SW may be turned on prior to or subsequent to a turn on operation of the second transfer transistor TX2.

While the switch element SW is maintained in a turned on state, the controller may turn off the second transfer transistor TX2 and turn on the overflow transistor OX to remove the electric charge of the second photodiode PD2. The controller may also detect the second pixel voltage during a fifth sampling time t5, and may detect the second reset voltage during a sixth sampling time t6 subsequent to the fifth sampling time t5. Between the fifth sampling time t5 and the sixth sampling time t6, the controller may turn on the first reset transistor RX1 to reset voltages of the first floating diffusion FD1 and the second floating diffusion FD2.

The controller may calculate a difference between the second pixel voltage and the second reset voltage to generate second raw data. The second raw data may be data corresponding to an electric charge generated in the second photodiode PD2 during the second exposure time de2, which is shorter than the first exposure time de1. In other words, the second raw data may be data corresponding to an intermediate exposure time. Further, since the second photodiode PD2 is controlled to generate an electric charge by setting the second exposure time de2 over a plurality of times, an external light source such as an LED, or the like, which generates the flicker phenomenon, may be captured accurately using the second raw data. The length and the number of times of the second exposure time de2 may be determined in consideration of an operating frequency and a duty ratio of the external light source such as an LED, or the like.

When entering a third time D3 after the second time D2, the controller may expose the first photodiode PD1 to light during a third exposure time de3. The third exposure time de3 may be shorter than the second exposure time de2. The first reset transistor RX1 may be turned off and the second reset transistor RX2 may be turned on during the third time D3, and the controller may obtain a third reset voltage during a seventh sampling time t7 and a third pixel voltage during an eighth sampling time t8, in sequence. The controller may obtain third raw data using the difference between the third reset voltage and the third pixel voltage.

The controller may generate image data using the first raw data, the second raw data, and the third raw data. Since the first to third raw data may be obtained using the electric charges generated by the first and second photodiodes PD1 and PD2 during the different exposure times de1 to de3, a dynamic range of an image sensor may be increased by combining the first to third raw data. Further, the second photodiode PD2 may be controlled to generate an electric charge in the second exposure time de2 a plurality of times. Therefore, the external light source in which a flicker phenomenon occurs may also be accurately captured.

Figure 24:
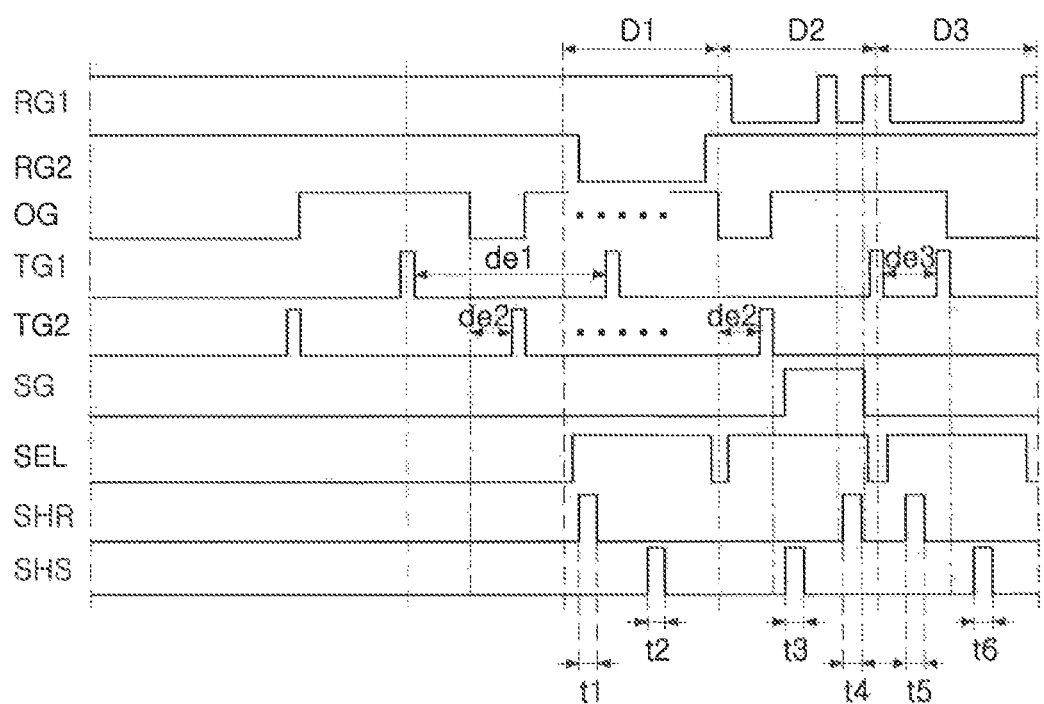

In an exemplary embodiment of the present inventive concept illustrated in FIG. 24, an image sensor may operate similarly to the embodiment illustrated in FIG. 23. During a first time D1, a controller may detect a first reset voltage and a first pixel voltage once to generate first raw data corresponding to a first exposure time de1. Therefore, in the embodiment illustrated in FIG. 24, an integration time of a unit in which an overflow transistor OX and a second transfer transistor TX2 are alternately turned on and off may be shorter than that in the embodiment illustrated in FIG. 23. In addition, an operation in each of a second time D2 and a third time D3 may be similar to that in the embodiment illustrated in FIG. 23.

Figure 25:
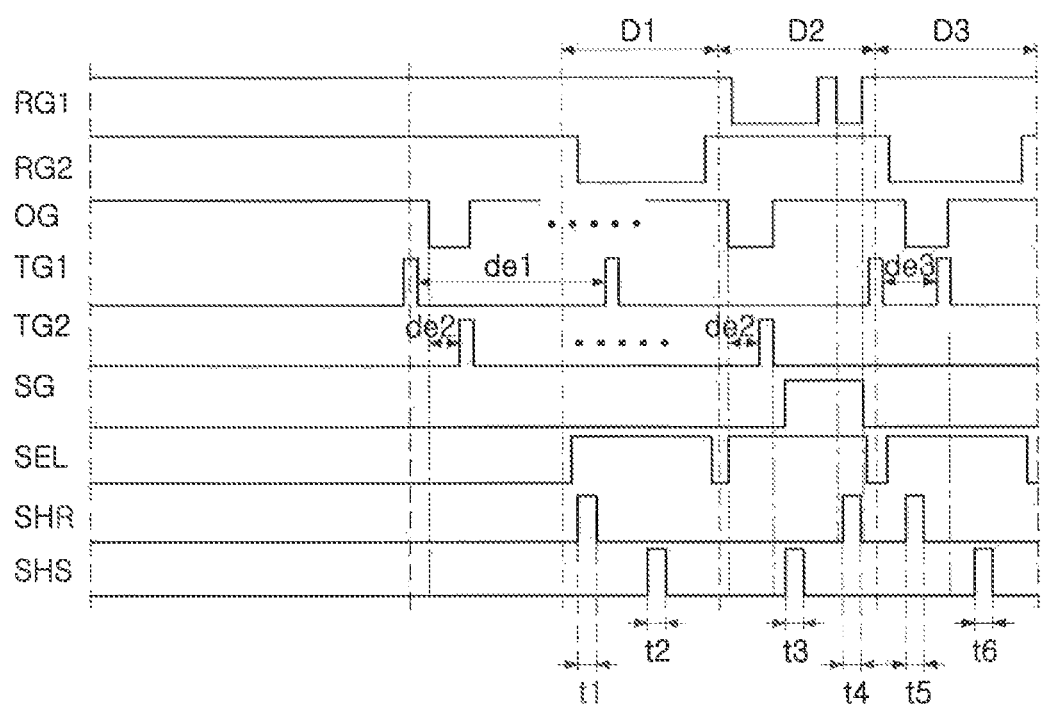

In the embodiment illustrated in FIG. 25, an image sensor may operate similarly to that of the embodiment illustrated in FIG. 24. A first exposure time de1 may start earlier than a second exposure time de2. For example, in the embodiment illustrated in FIG. 25, a shutter operation for a first photodiode PD1 may be performed prior to a shutter operation for a second photodiode PD2. An integration time of a unit in the embodiment illustrated in FIG. 25 may be the same as or shorter than that in the embodiment illustrated in FIG. 24.

In addition, in the embodiment illustrated in FIG. 25, an operation in a third time D3 may be different from those in the embodiments illustrated in FIGS. 23 and 24. Referring to FIG. 25, a first reset transistor RX1 may be turned on and a second reset transistor RX2 may be turned off during the third time D3. Therefore, an electric charge generated by the first photodiode PD1 during a third exposure time de3 may be accumulated only in a first floating diffusion FD1, and thus, the controller may acquire a third pixel voltage at a relatively high conversion gain condition.

In the embodiments described with reference to FIGS. 23 to 25, the second photodiode PD2 may generate an electric charge by switching the overflow transistor OX and the second transfer transistor TX2 a plurality of times. The ratio and number of turn-on times of the overflow transistor OX and the second transfer transistor TX2 may be determined in consideration of the operating frequency and the duty ratio of the external light source in which the flicker phenomenon occurs. Further, in other exemplary embodiments of the present inventive concept, the second exposure time at which the second photodiode PD2 generates the electric charge may be set long enough to accurately capture the external light source in which the flicker phenomenon appears. The following description will be made with reference to FIGS. 26 and 27.

Figure 26:
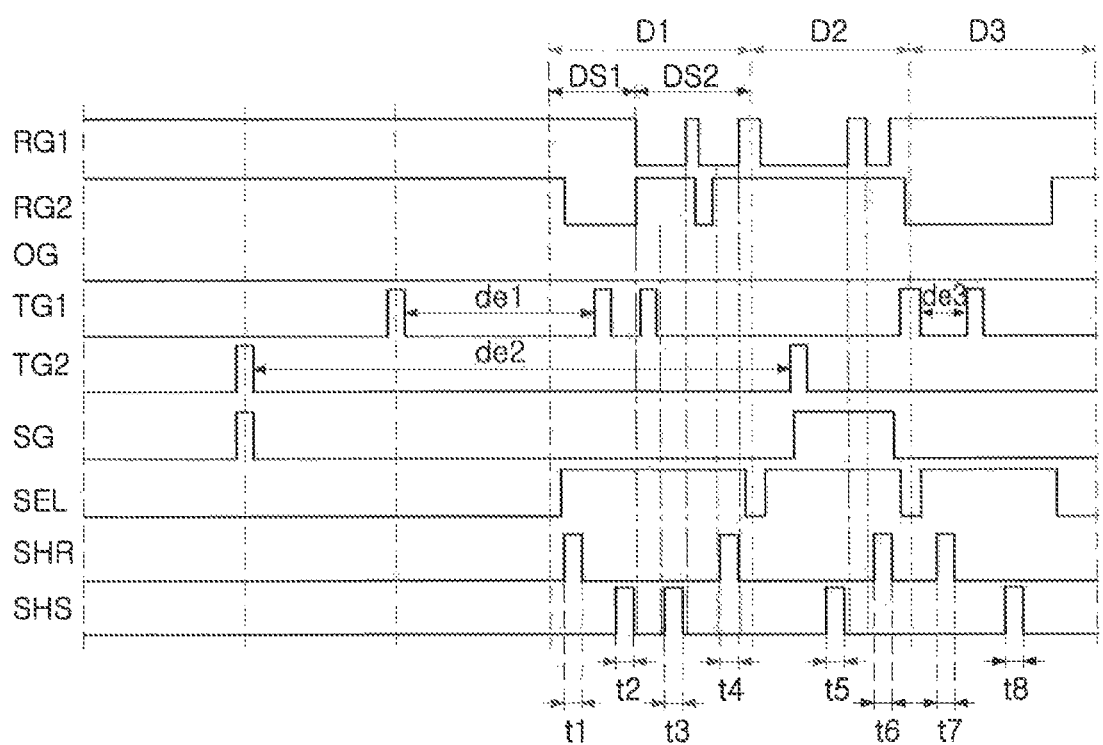

Referring first to FIG. 26, an operation of an image sensor may start such that a controller turns on a first reset transistor RX1 and a second reset transistor RX2 to reset voltages of a first floating diffusion FD1 and a second floating diffusion FD2. The controller may then perform a shutter operation to reset a second photodiode PD2 and a storage capacitor SC by turning on a second transfer transistor TX2 and a switch element SW. When the shutter operation is completed, the second photodiode PD2 may generate an electric charge during a second exposure time de2. The electric charge generated by the second photodiode PD2 during the second exposure time de2 may be stored in the storage capacitor SC by an overflow phenomenon.

During the second exposure time de2, the first photodiode PD1 may also generate an electric charge. The first photodiode PD1 may generate an electric charge during a first exposure time de1, and the controller may detect voltages used to generate first row data during a first time D1. For example, the first time D1 may include a first sub-time DS1 and a second sub-time DS2, and the controller may detect a first sub-reset voltage and a first sub-pixel voltage at each of a first sampling time t1 and a second sampling time t2 of the first sub-time DS1. In addition, the controller may detect the second sub-pixel voltage and the second sub-reset voltage at each of a third sampling time t3 and a fourth sampling time t4 of the second sub-time DS2. For example, the operation of the image sensor at the first time D1 may be similar to that described in the embodiment of FIG. 23. The operation of the image sensor at a third time D3 may be similar to that described in the embodiment of FIG. 23.

The second exposure time de2 may end in a second time D2 subsequent to the first time D1. The second exposure time de2 may end by turning on the second transfer transistor TX2. The switch element SW may also be turned on, together with the second transfer transistor TX2. As the switch element SW is turned on, an electric charge stored in the storage capacitor SC during the second exposure time de2 may move to the floating diffusion. Since the second reset transistor RX2 is turned on during the second time D2, the electric charge of the storage capacitor SC may move to the first floating diffusion FD1 and the second floating diffusion FD2. A portion of the electric charge of the storage capacitor SC may be stored in a turned on capacitance of the second reset transistor RX2.

The controller may detect the second pixel voltage during a fifth sampling time t5, and detect the second reset voltage during a sixth sampling time t6 in the second time D2. The second exposure time de2 may be determined in consideration of the operating frequency of the light source in which a flicker phenomenon occurs. For example, the second exposure time de2 may be longer than the inverse number of the operation frequency of the light source in which a flicker phenomenon occurs, e.g., the operation period. Therefore, the light source may be accurately captured despite the flicker phenomenon.

In the embodiment illustrated in FIG. 26, the controller may generate first to third raw data using a difference between the reset voltages and pixel voltages obtained in each of the first to third times D1 to D3. The second raw data may also be used as data for detecting the light source in which a flicker phenomenon appears. The controller may combine the first to third raw data and conversion gain conditions generated at different exposure times de1 to de3, to generate image data. Therefore, dynamic range of the image sensor may be increased.

Figure 27:
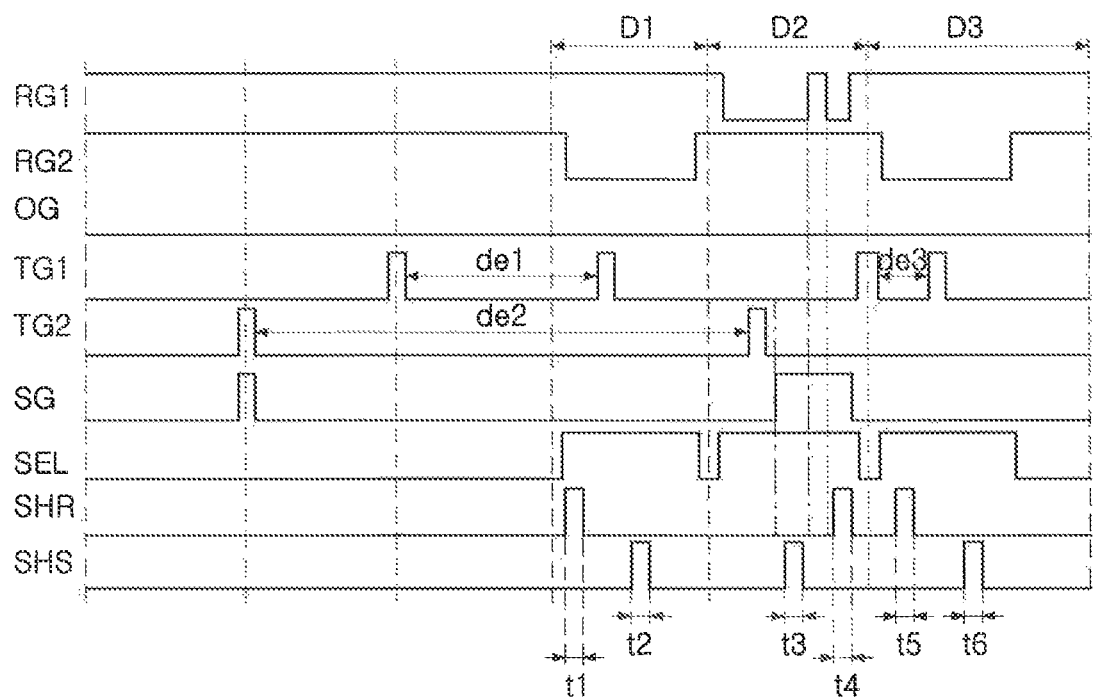

An operation of an image sensor according to an exemplary embodiment of the present inventive concept illustrated in FIG. 27 may be similar to the embodiment illustrated in FIG. 26. At a first time D1, a controller may detect only a first reset voltage and a first pixel voltage only once, without changing an area of a floating diffusion. In addition, in a second time D2, a second transfer transistor TX2 may be turned on and off. Therefore, an electric charge that is not transferred to a storage capacitor SC due to an overflow phenomenon may be transferred to the storage capacitor SC. A switch element SW may be turned on later. Other operations may be the same as those described for the embodiment of FIG. 27.

Figure 28:
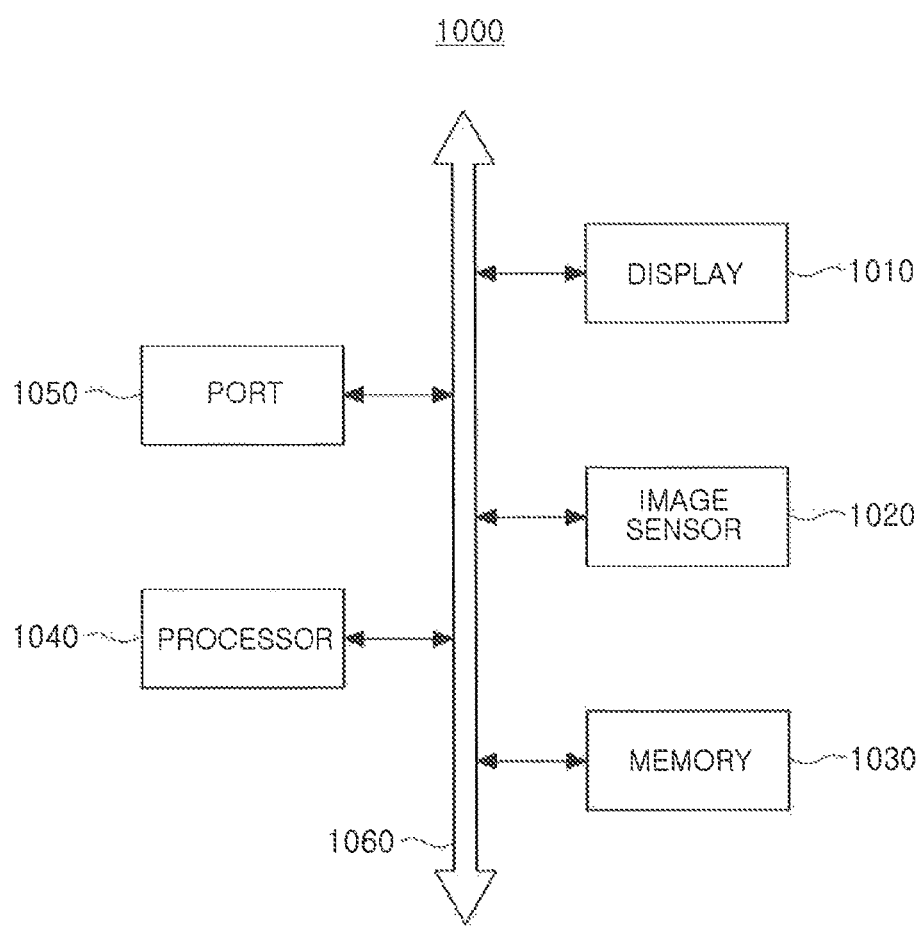
FIG. 28 is a block diagram illustrating an electronic device including an image sensor according to an exemplary embodiment of the present inventive concept.

FIG. 28 is a block diagram illustrating an electronic device including an image sensor according to an exemplary embodiment of the present inventive concept.

A computer device 1000 according to the embodiment illustrated in FIG. 28 may include a display 1010, an image sensor 1020, a memory 1030, a processor 1040, a port 1050, and the like. In addition, the computer device 1000 may further include a wired/wireless communications unit, a power supply unit, and the like. Among the components illustrated in FIG. 28, the port 1050 may be a device in which the computer device 1000 is provided for communicating with a video card, a sound card, a memory card, a universal serial bus (USB) device, and the like. The computer device 1000 may be a desktop computer, a laptop computer, a smartphone, a tablet personal computer (PC), a smart wearable device, and the like.

The processor 1040 may perform specific operations, commands, tasks, and the like. The processor 1040 may be a central processing unit or a microprocessor unit, and may be connected to the display 1010, the image sensor 1020, the memory device 1030, as well as to other units connected the port 1050, through a bus 1060.

The memory 1030 may be storage medium for storing data, or multimedia data for operating the computer device 1000. The memory 1030 may include a volatile memory, such as a random access memory, or a non-volatile memory, such as a flash memory. The memory 1030 may also include a solid state drive, a hard disk drive, or an optical drive as a storage unit. The computer device 1000 may comprise an input device such as a keyboard, a mouse, a touch screen and the like, and an output device such as a display, an audio output, etc., to be provided to a user.

The image sensor 1020 may be mounted on a package substrate and connected to the processor 1040 by the bus 1060, or other communications means. The image sensor 1020 may be used in the computer device 1000 in the form of various embodiments described with reference to FIGS. 1 to 27.

According to an exemplary embodiment of the present inventive concept, an electric charge generated by a first photodiode and a second photodiode included in each of a plurality of pixels of an image sensor may be used to accurately detect light from an external light source having a flicker phenomenon. Further, an exposure time of the first photodiode and the second photodiode may be controlled in different times. Therefore, a dynamic range of an image sensor may be increased, and quality of an image generated by the image sensor may be increased.

While the present inventive concept has been shown and described with reference to exemplary embodiments thereof, it will be apparent to those skilled in the art that modifications and variations could be made thereto without departing from the scope of the present inventive concept as defined by the appended claims.

What is claimed is:

1. An image sensor, comprising:
a first photodiode;
a first circuit including an overflow transistor and a first transfer transistor connected to the first photodiode, a switch element connected to the first transfer transistor and a capacitor disposed between the first transfer transistor and the switch element, wherein the capacitor is a physical capacitor;
a second photodiode; and
a second circuit including a second transfer transistor connected to the second photodiode, a reset transistor connected to an output of the first circuit and a driving transistor connected to the second transfer transistor and the output of the first circuit.

2. The image sensor of claim 1, wherein the capacitor is a metal-insulator-metal (MIM) cap.

3. The image sensor of claim 1, wherein a terminal of the capacitor is connected to a pixel voltage.

4. The image sensor of claim 1, wherein a terminal of the overflow transistor is connected to a pixel voltage.

5. The image sensor of claim 1, wherein a channel of the first transfer transistor, the switch element or the second transfer transistor includes indium gallium zinc oxide.

6. The image sensor of claim 1, wherein a floating diffusion node is disposed between the second transfer transistor and the driving transistor.

7. The image sensor of claim 6, wherein the second photodiode is first sensed for a first period of time when the driving transistor is off and the second photodiode is second sensed for a second period of time when the driving transistor is off, wherein the first period of time is longer than the second period of time.

8. The image sensor of claim 7, wherein the first period of time overlaps a period of time in which the first photodiode is sensed and read, and the second period of time does not overlap the period of time in which the first photodiode is sensed and read.

9. The image sensor of claim 6, wherein the second photodiode is first sensed for a first period of time when the driving transistor is on and the second photodiode is second sensed for a second period of time when the driving transistor is off, wherein the first period of time is longer than the second period of time.

10. An image sensor, comprising:
a pixel array including a plurality of pixels, a first pixel including a first photodiode, a first pixel circuit, a second photodiode, and a second pixel circuit,
wherein the first pixel circuit includes an overflow transistor and a first transfer transistor connected to the first photodiode, a switch element connected to the first transfer transistor and a capacitor connected between the first transfer transistor and the switch element,
wherein the second pixel circuit includes a second transfer transistor connected to the second photodiode, a driving transistor connected to a floating diffusion node, and a reset transistor connected to a pixel voltage,
wherein the image sensor further comprises a controller configured to turn the driving transistor on and off to sense the second photodiode a plurality of times.

11. The image sensor of claim 10, wherein the capacitor is a metal-insulator-metal (MIM) capacitor.

12. The image sensor of claim 10, wherein the capacitor is a physical capacitor.

13. The image sensor of claim 10, wherein a first sensing time of the second photodiode is longer than a second sensing time of the second photodiode, wherein the second sensing time occurs after the first sensing time.

14. The image sensor of claim 13, wherein the driving transistor is on during the first sensing time and off during the second sensing time.

15. The image sensor of claim 13, wherein the driving transistor is off during the first sensing time and off during the second sensing time.

16. The image sensor of claim 10, wherein the capacitor, the overflow transistor and the reset transistor are provided with the same voltage.

17. The image sensor of claim 10, wherein an output of the first circuit is provided to a node between the reset transistor and the driving transistor.

18. The image sensor of claim 10, wherein the first photodiode is smaller than the second photodiode.

19. The image sensor of claim 10, wherein the driving transistor is connected to an output node of the first circuit which functions as a floating diffusion area when the second photodiode is exposed to light.

20. The image sensor of claim 10, wherein the second photodiode is first sensed for a first time and the second photodiode is second sensed for a plurality of second times, wherein each of the second times is shorter than the first time.

* * * * *